US009957340B2

(12) United States Patent
Chiba et al.

(10) Patent No.: US 9,957,340 B2
(45) Date of Patent: May 1, 2018

(54) IMPRINTING METHOD AND CURABLE COMPOSITION FOR IMPRINTING

(71) Applicant: CANON KABUSHIKI KAISHA, Tokyo (JP)

(72) Inventors: Keiko Chiba, Utsunomiya (JP); Toshiki Ito, Kawasaki (JP); Akiko Iimura, Utsunomiya (JP); Youji Kawasaki, Utsunomiya (JP); Keiji Yamashita, Utsunomiya (JP); Jun Kato, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 280 days.

(21) Appl. No.: 14/647,943

(22) PCT Filed: Nov. 26, 2013

(86) PCT No.: PCT/JP2013/082311
§ 371 (c)(1),
(2) Date: May 28, 2015

(87) PCT Pub. No.: WO2014/084395
PCT Pub. Date: Jun. 5, 2014

(65) Prior Publication Data
US 2015/0315322 A1 Nov. 5, 2015

(30) Foreign Application Priority Data
Nov. 30, 2012 (JP) .................................. 2012-263533
Oct. 17, 2013 (JP) .................................. 2013-216663
Oct. 17, 2013 (JP) .................................. 2013-216664
Nov. 22, 2013 (JP) .................................. 2013-242001

(51) Int. Cl.
H01L 21/027 (2006.01)
C08F 20/18 (2006.01)
B29C 59/02 (2006.01)
C08F 222/20 (2006.01)
C08F 222/10 (2006.01)
B29C 59/00 (2006.01)
B29C 59/16 (2006.01)
G03F 7/028 (2006.01)
G03F 7/029 (2006.01)
C08F 220/18 (2006.01)
C09D 133/08 (2006.01)
C08L 33/08 (2006.01)
G03F 7/00 (2006.01)
G03F 7/027 (2006.01)
B29K 33/04 (2006.01)
B29L 11/00 (2006.01)
B29L 31/34 (2006.01)
B29K 33/00 (2006.01)

(52) U.S. Cl.
CPC .......... *C08F 222/20* (2013.01); *B29C 59/005* (2013.01); *B29C 59/02* (2013.01); *B29C 59/022* (2013.01); *B29C 59/16* (2013.01); *C08F 220/18* (2013.01); *C08F 222/10* (2013.01); *C08F 222/1006* (2013.01); *C08L 33/08* (2013.01); *C09D 133/08* (2013.01); *G03F 7/0002* (2013.01); *G03F 7/027* (2013.01); *G03F 7/028* (2013.01); *G03F 7/029* (2013.01); *B29K 2033/12* (2013.01); *B29L 2011/00* (2013.01); *B29L 2031/3406* (2013.01); *C08F 2222/1013* (2013.01); *C08L 2312/00* (2013.01)

(58) Field of Classification Search
CPC .............. C08F 222/10; C08F 222/1006; C08F 2222/1013; C09D 133/08; C08L 33/08; G03F 7/004; G03F 7/027; G03F 7/028; G03F 7/029; B29C 59/00; B29C 59/02; B29C 59/022; B29C 59/16
USPC ......................................... 264/447, 494, 299
See application file for complete search history.

(56) References Cited

U.S. PATENT DOCUMENTS

2005/0072755 A1   4/2005   McMackin
2007/0160937 A1*  7/2007   Ogino ................... B82Y 10/00
                                                    430/311
(Continued)

FOREIGN PATENT DOCUMENTS

CN    101000462 A    7/2007
JP    2004-103817 A  4/2004
(Continued)

OTHER PUBLICATIONS

International Preliminary Report on Patentability for PCT/JP2013/082311, dated Jun. 2, 2015, 6 pages.*
(Continued)

*Primary Examiner* — William P Fletcher, III
(74) *Attorney, Agent, or Firm* — Canon U.S.A. Inc., IP Division

(57) ABSTRACT

An imprinting method for forming a pattern of a cured product by irradiating a curable composition for imprinting disposed on a substrate with light while the curable composition is in contact with a mold having surface asperities and removing the mold from a cured product of the curable composition. The method includes bringing the mold into contact with the curable composition in a condensable gas atmosphere, wherein the curable composition for imprinting has a viscosity in the range of 1 cP to 40 cP in air at 23° C., and the condensable gas is introduced between the mold and the curable composition such that the curable composition for imprinting has a condensable gas solubility (gas/(curable composition+gas)) (g/g) in the range of 0.1 to 0.4.

11 Claims, 8 Drawing Sheets

(56) References Cited

U.S. PATENT DOCUMENTS

2008/0308971 A1    12/2008   Liu
2009/0115110 A1     5/2009   Schumaker
2013/0214453 A1*    8/2013   Umekawa .............. B82Y 10/00
                                                                          264/293

FOREIGN PATENT DOCUMENTS

| JP | 3700001 B2 | | 9/2005 |
| JP | 2006-188040 A | | 7/2006 |
| JP | 2007-186570 A | * | 7/2007 |
| JP | 2010-000612 A | * | 1/2010 |
| JP | 2010-206115 A | | 9/2010 |
| JP | 2011-54269 A | | 3/2011 |
| JP | 2011-060818 A | | 3/2011 |
| JP | 2012-164785 A | | 8/2012 |
| JP | 2012-214022 A | * | 11/2012 |
| JP | 2012-216799 A | * | 11/2012 |
| TW | 201129869 A | | 9/2011 |

OTHER PUBLICATIONS

Kaneko et al., Morphological Changes in Ultraviolet-Nanoimprinted Resin Patterns Caused by Ultraviolet-Curable Resins Absorbing Pentafluoropropane, Jpn. J. Appl. Phys. 51 (2012) 6 pages.*

Shu Kaneko, et al, Morphological Changes in Ultraviolet-Nanoimprinted Resin Patterns Caused by Ultraviolet-Curable Resins Absorbing Pentafluoropropane, Japanese Journal of Applied Physics, vol. 51, pp. 06FJ05-1-06FJ05-6 (2012), as downloaded from iopscience.iop.org.

Hiroshima, Hiroshi, "Quick Cavity Filling in UV Nanoimprint Using Pentafluoropropane", Japanese Journal of Applied Physics, (2008), pp. 5151-5155, vol. 47, No. 6.

Kaneko et al., "Morphological Changes in Ultraviolet-Nanoimprinted Resin Patterns Caused by Ultraviolet-Curable Resins Absorbing Pentafluoropropane", Japanese Journal of Applied Physics, (2012), pp. 06FJ05-1-06FJ05-6, vol. 51.

* cited by examiner

FIG. 1A
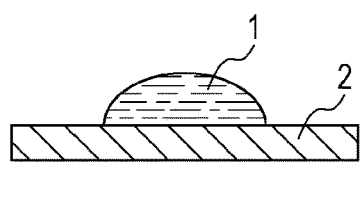
FIG. 1B
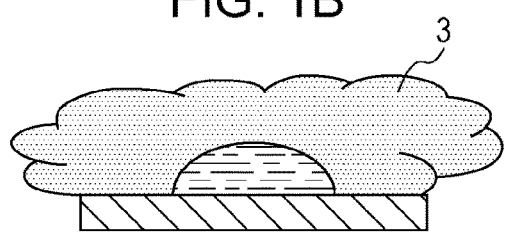
FIG. 1C1
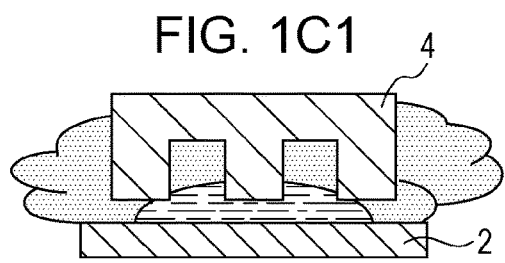
FIG. 1C2
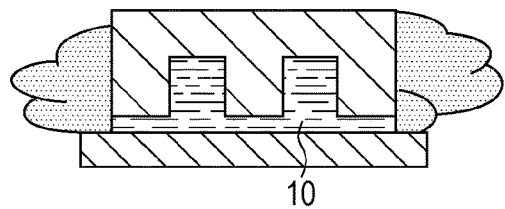
FIG. 1D
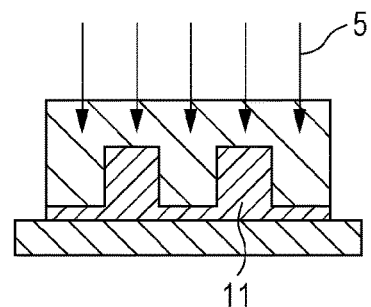
FIG. 1E
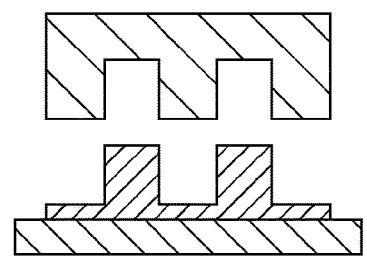
FIG. 1F
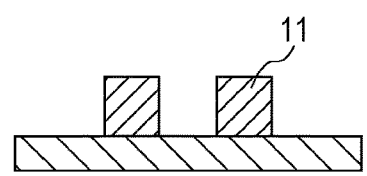
FIG. 1G
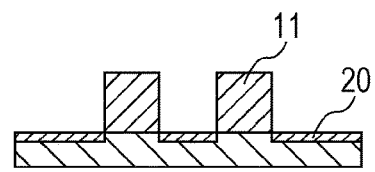

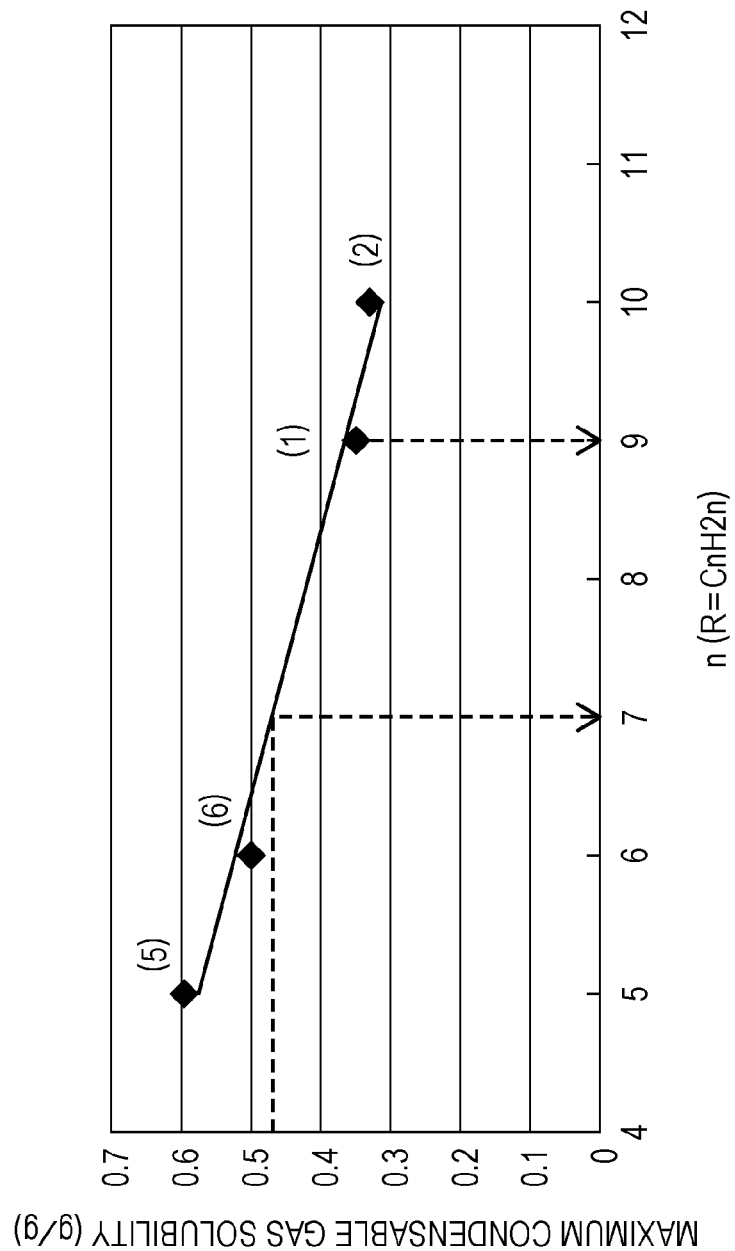

IMPRINTING METHOD AND CURABLE COMPOSITION FOR IMPRINTING

TECHNICAL FIELD

The present invention relates to an imprinting method and a curable composition for imprinting.

BACKGROUND ART

With the growing demand for smaller semiconductor devices and MEMS's, in addition to conventional photolithography techniques, microfabrication technologies are gaining attention. In such a microfabrication technology, a mold having surface asperities is pressed against a resist (curable composition) on a substrate (wafer) to form a resist pattern on the substrate.

This technique is also referred to as an UV imprinting technique and can form a fine structure on the order of nanometers on a substrate. First, a resist is applied to a patterning region on a substrate in an UV imprinting apparatus. The resist is then patterned with a patterning mold. After the resist is cured by light irradiation, the mold is removed. A resin pattern (photo-cured product) corresponding to the asperities of the mold is formed on the substrate.

In the formation of the resin pattern (photo-cured product), it is desirable that the residual layer thickness of the resin pattern (photo-cured product) be made uniform on the surface of the substrate. This aims to reduce in-plane variations in line width in dry etching in a step other than a patterning step with an imprinting apparatus, for example, in an etching step, for example, in a semiconductor device manufacturing process. In order to make the residual layer thickness of a resin pattern (photo-cured product) uniform, PTL 1 discloses an imprinting method for optimizing the arrangement of resist droplets in a manner that depends on the density of a pattern to be transferred in the application of a resist on a substrate using an ink jet method. In this imprinting method for discretely arranging the resist on the substrate, however, the resist is difficult to spread on the substrate. Thus, when a patterned portion of a mold is pressed against the resist on the substrate, air bubbles often remain between the patterned portion and the resist. Curing of the resist with residual air bubbles can result in the formation of a resin pattern (photo-cured product) having an unintended shape. Waiting for the disappearance of residual air bubbles reduces productivity. PTL 2 discloses a method for promoting the disappearance of residual air bubbles by introducing a condensable gas that can condense under certain temperature and/or pressure conditions between a mold and a substrate and utilizing a volume reduction associated with the condensation of the gas. The condensable gas used in PTL 2 is trichlorofluoromethane ($CFCl_3$). NPL 1 reports that use of 1,1,1,3,3-pentafluoropropane ($CHF_2CH_2CF_3$) as a condensable gas can improve filling.

In such a condensable gas atmosphere, a large amount of gas dissolves in uncured resist. Thus, while the mold is removed from the resin (photo-cured product) on the substrate after photo-curing of the resist, the gas dissolved in the resist volatilizes and forms bubbles. NPL 2 reports that a larger amount of foaming gas causes a larger deviation from an intended shape of the photo-cured product (for example, higher surface roughness), which should be the same shape as the mold. NPL 2 recommends the use of a resist that dissolves no condensable gas. NPL 2 also describes a monomer having an ether group or a hydroxy group to reduce condensable gas solubility. However, monomers described in the literature have high viscosities and are difficult to apply using the ink jet method.

As described above, in order to prevent the formation of a cured product having an unintended shape, the amount of condensable gas that dissolves in a composition is minimized. However, the present inventors found that a larger amount of condensable gas dissolved in a composition results in a lower demolding force when the photo-cured resin is removed from the mold.

A high demolding force may result in the formation of a photo-cured product having an unintended shape because of a residual photo-cured product in a mold, fracture of a photo-cured product, or toppling of a photo-cured product pattern on a substrate, thus causing the same problem as that caused by a large amount of dissolved condensable gas. Thus, the present inventors found that, in imprinting using a condensable gas, reduction in demolding force is contradictory to reduction in surface roughness and pattern shrinkage of a photo-cured product with respect to gas solubility in a composition and that it is important to simultaneously solve these problems.

CITATION LIST

Patent Literature

PTL 1 U.S. Patent Application Publication No. 2009/0115110

PTL 2 Japanese Patent No. 3700001

Non Patent Literature

NPL 1 Hiroshi Hiroshima, "Quick Cavity Filling in UV Nanoimprint Using Pentafluoropropane", Jan. J. Appl. Phys. Vol. 47, No. 6, 2008, pp. 5151-5155

NPL 2 Shu Kaneko, "Morphological Changes in Ultraviolet-Nanoimprinted Resin Patterns Caused by Ultraviolet-Curable Resins Absorbing Pentafluoropropane", Jan. J. Appl. Phys. Vol. 51, (2012) 06FJ05

SUMMARY OF INVENTION

Technical Problem

In view of such situations, the present invention provides a curable composition for imprinting that can reduce the surface roughness and shrinkage of a cured pattern and demolding force and an imprinting method including the use of the curable composition for imprinting.

Solution to Problem

A curable composition for imprinting according to one aspect of the present invention is a curable composition for imprinting in a condensable gas atmosphere, wherein the maximum condensable gas solubility (gas/(curable composition+gas)) (g/g) is 0.1 or more and 0.4 or less, and the curable composition for imprinting has a viscosity of 40 cP or less at 23° C. The maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas.

A curable composition for imprinting according to another aspect of the present invention is a curable composition for imprinting in a condensable gas atmosphere, the curable composition for imprinting containing at least one (meth)acrylate monomer as an (A) component, and a polymerization initiator as a (B) component, wherein the (A) component has a carbon atom ring structure, and the relationship between the amount of carbon $M_{CR}$ of the ring structure and the total amount of carbon $M_{TOT}$ of the (A) component satisfies the following formula (mathematical formula 1), and the curable composition for imprinting has a viscosity of 40 cP or less at 23° C.

$$0.3 < M_{CR}/M_{TOT} \leq 0.8 \quad \text{(mathematical formula 1)}$$

A curable composition for imprinting according to another aspect of the present invention is a curable composition for imprinting in a condensable gas atmosphere, the curable composition for imprinting containing at least one (meth)acrylate monomer as an (A) component, and a polymerization initiator as a (B) component, wherein the relationship between the total number of atoms $N_{TOT}$, the total number of carbon atoms $N_C$, and the total number of oxygen atoms $N_O$ of the (A) component satisfies the following formula (mathematical formula 2), and the curable composition for imprinting has a viscosity of 40 cP or less at 23° C.

$$2.5 < N_{TOT}/(N_C-N_O) < 3.8 \quad \text{(mathematical formula 2)}$$

A curable composition for imprinting according to another aspect of the present invention is a curable composition for imprinting in a condensable gas 1,1,1,3,3-pentafluoropropane atmosphere, the curable composition for imprinting containing at least one (meth)acrylate monomer as an (A) component, and a polymerization initiator as a (B) component, wherein the Hansen distance (Ra) between 1,1,1,3,3-pentafluoropropane and the monomer of the (A) component and the molecular weight (MW) of the monomer satisfy the following formula (mathematical formula 3), and the curable composition for imprinting has a viscosity of 40 cP or less at 23° C., $$800 < Ra*MW < 3800\ [(MPa)^{1/2}] \quad \text{(mathematical formula 3)}$$

wherein the Hansen distance (Ra) is defined by the following formula (mathematical formula 4), $$Ra = (4(\delta_{dm}-16)^2 + (\delta_{pm}-3)^2 + (\delta_{hm}-9)^2)^{1/2} \quad \text{(mathematical formula 4)}$$

wherein the Hansen solubility parameters (dispersion, polarity, and hydrogen bonding) of 1,1,1,3,3-pentafluoropropane are 16, 3, and 9 [(MPa)$^{1/2}$], and $\delta_{dm}$, $\delta_{pm}$, and $\delta_{hm}$, [(MPa)$^{1/2}$] denote the Hansen solubility parameters (dispersion, polarity, and hydrogen bonding) of the monomer. The Hansen solubility parameters of monomers are calculated values of software Hansen Solubility Parameters in Practice (HSPiP) 4th Edition. 4.0.05, which calculates the Hansen solubility parameter from the chemical structure of a monomer.

A curable composition for imprinting according to another aspect of the present invention is a curable composition for imprinting in a condensable gas atmosphere, containing at least two (meth)acrylate monomers as (A) component monomers and a polymerization initiator as a (B) component, wherein the maximum condensable gas solubility (gas/(curable composition+gas)) (g/g) difference between the (A) component monomers is 0.23 or less, and the curable composition for imprinting has a viscosity of 40 cP or less at 23° C.

A curable composition for imprinting according to another aspect of the present invention is a curable composition for imprinting in a condensable gas 1,1,1,3,3-pentafluoropropane atmosphere, the curable composition for imprinting containing at least one (meth)acrylate monomer as an (A) component, and a polymerization initiator as a (B) component, at least one of the (A) component monomer has a viscosity of 40 cP or less at 23° C. and includes a structure having the general formula (Chem. 1) wherein n is 9 or more.

[Chem. 1]

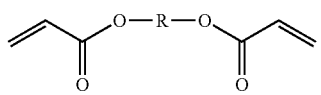
(Chem. 1)

wherein R = $C_nH_{2n}$

A curable composition for imprinting according to another aspect of the present invention is a curable composition for imprinting in a condensable gas 1,1,1,3,3-pentafluoropropane atmosphere, the curable composition for imprinting containing at least one (meth)acrylate monomer as an (A) component, and a polymerization initiator as a (B) component, wherein at least one of the (A) component monomer has a viscosity of 40 cP or less at 23° C. and includes structures having the following general formulae (Chem. 2) and (Chem. 3).

[Chem. 2]

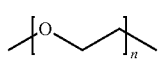
(Chem. 2)

[Chem. 3]

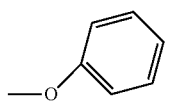
(Chem. 3)

The present invention can provide a curable composition for imprinting that can reduce the surface roughness and pattern shrinkage of a cured product and demolding force and an imprinting method including the use of a condensable gas.

Further features of the present invention will become apparent from the following description of exemplary embodiments with reference to the attached drawings.

BRIEF DESCRIPTION OF DRAWINGS

FIGS. 1A to 1G are schematic cross-sectional views of each step of producing a photo-cured product and a circuit board in accordance with a manufacturing method according to an embodiment of the present invention.

FIG. 8 is a graph of the correlation between maximum condensable gas solubility and n in the general formula (Chem. 1) of the (A) component according to an embodiment of the present invention.

DESCRIPTION OF EMBODIMENTS

Figure 2A:
FIGS. 2A and 2B are plan views of discrete portions of a curable composition.

The present invention will be further described in the following embodiments. The present invention is not limited to these embodiments. Various alterations and modifications can be made in these embodiments on the basis of the common knowledge of a person skilled in the art without departing from the gist of the present invention. Such alterations and modifications also fall within the scope of the present invention.

(Curable Composition for Imprinting)

A curable composition for imprinting according to an embodiment of the present invention contains a (meth)acrylate monomer (A) component and a polymerization initiator (B) component. The curable composition for imprinting may contain other additive components. The components will be described below.

<(A) Component: (Meth)Acrylate Monomer>

The (meth)acrylate monomer (A) component of the curable composition according to the present embodiment is photocurable and functions as a photo-curing component.

The (meth)acrylate monomer of the (A) component may be used alone or in combination.

In order to solve the problems of known imprinting methods, the present inventors made extensive studies on curable compositions having appropriate gas solubility in the resist (curable composition).

As a result, the present inventors found that a curable composition for imprinting having a maximum condensable gas solubility (gas/(curable composition+gas)) (g/g) of 0.1 or more and 0.4 or less and having a viscosity of 40 cP or less at 23° C. is suitable for this purpose.

The present inventors found that for a curable composition for imprinting composed of at least two monomers, the maximum condensable gas solubility difference between the monomers may be 0.23 or less and having a viscosity of 40 cP or less at 23° C. is suitable for this purpose.

The maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas.

As a result of further studies, the present inventors also found the following relationships.

(1) The amount of carbon of the ring structure relative to the total carbon of the (A) component of the curable composition correlates with gas solubility in the resist.

First Embodiment (2) The relationship between the total number of atoms $N_{TOT}$, the total number of carbon atoms $N_C$, and the total number of oxygen atoms $N_O$ of the (A) component of the curable composition correlates with gas solubility in the resist.

Second Embodiment (3) The product of the Hansen distance between the condensable gas and the (A) component of the curable composition and the molecular weight of the (A) component correlates with gas solubility in the resist.

Third Embodiment (4) An increase in n in the general formula (Chem. 1) of the (A) component of the curable composition results in a decrease in gas solubility in the resist.

Fourth Embodiment

[Chem. 1]

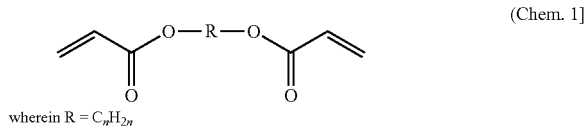

(Chem. 1)

wherein $R = C_nH_{2n}$ (5) The presence of the structures having the general formulae (Chem. 2) and (Chem. 3) in the (A) component of the curable composition results in low gas solubility in the resist.

Fifth Embodiment

[Chem. 2]

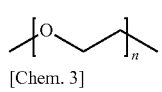

(Chem. 2)

[Chem. 3]

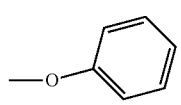

(Chem. 3)

In the first embodiment, the (A) component has a composition such that the relationship between the amount of carbon $M_{CR}$ of the ring structure and the total amount of carbon $M_{TOT}$ satisfies the following formula (mathematical formula 1).

$$0.3 < M_{CR}/M_{TOT} \leq 0.8 \quad \text{(mathematical formula 1)}$$

In the second embodiment, the relationship between the total number of atoms $N_{TOT}$, the total number of carbon atoms $N_C$, and the total number of oxygen atoms $N_O$ of the (A) component satisfies the following formula (mathematical formula 2).

$$2.5 < N_{TOT}/(N_C - N_O) < 3.8 \quad \text{(mathematical formula 2)}$$

In the third embodiment, the (A) component has a composition such that the Hansen distance (Ra) between the condensable gas and the (A) component monomer and the molecular weight (MW) of the monomer satisfies the following formula (mathematical formula 3) or (mathematical formula 5).

$$800 < Ra*MW < 3800 \ [(MPa)^{1/2}] \quad \text{(mathematical formula 3)}$$

$$900 < Ra*MW < 2200 \ [(MPa)^{1/2}] \quad \text{(mathematical formula 5)}$$

In the fourth embodiment, the (A) component has the general formula (Chem. 1) wherein n is 9 or more.

When n is 9 or more, the condensable gas solubility in the resist is less than 0.4, and the photo-cured film has a surface roughness PV of 4 nm or less.

The present inventors also found that when n in the general formula (Chem. 1) is 21 or less the (A) component is a liquid at room temperature (23° C.) at 1 atm. In the present embodiment, the (A) component has the general formula (Chem. 1) wherein n is 9 or more and 21 or less.

In the fifth embodiment, the (A) component includes the structures having the general formulae (Chem. 2) and (Chem. 3). When n is 4 or less, the condensable gas solubility in the resist is less than 0.4, and the photo-cured film has a surface roughness PV of 4 nm or less.

The curable compositions in these embodiments may be used alone or in combination.

Transferring of a pattern of less than 30 nm by nanoimprinting requires that the cured product should have a surface roughness PV (peak to valley) of 4 nm or less.

The surface roughness PV is a difference between the highest level and the lowest level of the surface roughness measured with an atomic force microscope. More specifically, the surface roughness PV is a difference between the highest level and the lowest level of the surface roughness of a 2 µm×2 µm area measured with an atomic force microscope Nanoscope manufactured by Nihon Veeco K.K.

The curable composition of any of the embodiments can be used in imprinting in a condensable gas atmosphere to produce a cured product having a surface roughness PV of 4 nm or less. The curable composition of any of the embodiments can have a reduced demolding force to remove a cured product of the curable composition from a mold. This can prevent the formation of a cured product having an unintended shape and improve productivity.

Examples of the polymerizable monomer used as the (A) component in the embodiments include, but are not limited to, acrylic monomers having an aromatic ring, such as benzyl (meth)acrylate, phenoxyethyl (meth)acrylate, and phenoxypoly(ethylene glycol) (meth)acrylate, acrylic monomers having an alicyclic structure, such as isobornyl (meth)acrylate, dicyclopentenyl (meth)acrylate, dicyclopentanyl (meth)acrylate, dicyclopentenyloxyethyl (meth)acrylate, 1-adamantyl (meth)acrylate, 2-methyl-2-adamantyl (meth)acrylate, 2-ethyl-2-adamantyl (meth)acrylate, 3-hydroxy-1-adamantyl (meth)acrylate, dimethyloltricyclodecane di(meth)acrylate, 1,3-adamantanedimethanol di(meth)acrylate, 1,3-adamantanediol di(meth)acrylate, and decalindimethanol di(meth)acrylate, acrylic monomers having a heterocycle, such as pentamethylpiperidinyl methacrylate, tetramethylpiperidinyl methacrylate, tetrahydrofurfuryl (meth)acrylate, n-vinylpyrrolidone, linear acrylic monomers, such as 1,9-nonanediol di(meth)acrylate, 1,10-decanediol di(meth)acrylate, dodecyl (meth)acrylate, octadecyl (meth)acrylate, and 2-hydroxyethyl (meth)acrylate, and branched acrylic monomers, such as isododecyl (meth)acrylate and isooctadecyl (meth)acrylate.

When the (A) component is a single monomer in the first embodiment, the monomer is selected such that the carbon atoms of the monomer molecule satisfy the formula (mathematical formula 1). When at least two monomers are used in combination, the monomer ratio is determined such that the average $M_{CR}/M_{TOT}$ calculated on the basis of the monomer ratio satisfies the formula (mathematical formula 1).

Thus, the (A) component may be composed of at least two (meth)acrylate monomers and may contain a (meth)acrylate monomer having $M_{CR}/M_{TOT} > 0.8$ or $M_{CR}/M_{TOT} \leq 0.3$, provided that the (A) component satisfies the formula (mathematical formula 1).

In the second embodiment, as a result of extensive studies on curable compositions having appropriate gas solubility in the resist, the relationship between the total number of atoms $N_{TOT}$, the total number of carbon atoms $N_C$, and the total number of oxygen atoms $N_O$ of the (A) component of the curable composition was also found to correlate with gas solubility in the resist.

In the present embodiment, the relationship between the total number of atoms $N_{TOT}$, the total number of carbon atoms $N_C$, and the total number of oxygen atoms $N_O$ of the (A) component satisfies the following formula (mathematical formula 2).

$$2.5 < N_{TOT}/(N_C - N_O) < 3.8 \quad \text{(mathematical formula 2)}$$

When the (A) component is a single monomer in the third embodiment, the monomer is selected such that the Hansen distance (Ra) between the monomer and 1,1,1,3,3-pentafluoropropane and the molecular weight (MW) of the monomer satisfy the formula (mathematical formula 3). When the (A) component is composed of at least two monomers, the calculation is based on the monomer ratio.

For example, when a monomer X (Ra(X), MW(X)), a monomer Y (Ra(Y), MW(Y)), and a monomer Z (Ra(Z), MW(Z)) are mixed at a ratio of x:y:z, Ra*MW is calculated using the following equation (mathematical formula 8). The monomer ratio is determined such that Ra*MW satisfies the formula (mathematical formula 8).

$$Ra*MW = (x*Ra(X)*MW(X) + y*Ra(Y)*MW(Y) + z*Ra(Z)*MW(Z))/(x+y+z) \quad \text{(mathematical formula 8)}$$

Thus, the (A) component may be composed of at least two (meth)acrylate monomers and may contain a (meth)acrylate monomer having Ra*MW>3800 or Ra*MW<800, provided that the (A) component satisfies the formula (mathematical formula 3).

For the (A) component composed of at least two monomers, the maximum condensable gas solubility difference between the monomers may be 0.23 or less.

The maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas.

Examples of the polymerizable monomer used as the (A) component in the fourth embodiment within the range described above include, but are not limited to, linear acrylic monomers, such as 1,9-nonanediol di(meth)acrylate, 1,10-decanediol di(meth)acrylate, dodecane di(meth)acrylate, 1,14-tetradecanediol di(meth)acrylate, 1,21-heneicosanediol diacrylate, and 1-hexyl-1,12-dodecanediol di(meth)acrylate, and branched acrylic monomers, such as isododecane di(meth)acrylate, isohexadecane di(meth)acrylate, isooctadecane di(meth)acrylate, 2,2,4-trimethyl-1,3-pentanediol di(meth) acrylate, and 2-butyl-2-ethyl-1,3-propanediol di(meth)acrylate.

When the (A) component is a single monomer in the fourth embodiment, the monomer to be used has the structure having the general formula (Chem. 1). For the (A) component composed of at least two monomers, at least one monomer has the structure having the general formula (Chem. 1).

Examples of the polymerizable monomer used as the (A) component in the fifth embodiment include, but are not limited to, phenoxypoly(ethylene glycol) acrylate, phenoxypoly(ethylene glycol) diacrylate, alkylphenoxypoly(ethylene glycol) acrylates, and alkylphenoxypoly(ethylene glycol) diacrylates.

When the (A) component is a single monomer, the monomer to be used has the structures having the general formulae (Chem. 2) and (Chem. 3). For the (A) component composed of at least two monomers, at least one monomer has the structures having the general formulae (Chem. 2) and (Chem. 3).

The following compounds may be added to a curable composition for imprinting according to an embodiment of the present invention without losing the advantages of the present invention.

A polymerizable compound constituting a curable composition according to an embodiment of the present invention may be a radical polymerizable compound or a cationic polymerizable compound.

The radical polymerizable compound may be a compound having at least one acryloyl or methacryloyl group. The cationic polymerizable compound may be a compound having at least one vinyl ether group, epoxy group, or oxetanyl group.

(Polymerizable Compound (A)—Radical Polymerizable Component)

Examples of monofunctional (meth)acrylic compounds having one acryloyl or methacryloyl group include, but are not limited to, phenoxyethyl (meth)acrylate, phenoxy-2-methylethyl (meth)acrylate, phenoxyethoxyethyl (meth) acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy(meth)acrylate, PO-modified phenoxy(meth)acrylate, polyoxyethylene nonylphenyl ether (meth)acrylate, isobornyl (meth)acrylate, 1-adamantyl (meth)acrylate, 2-methyl-2-adamantyl (meth) acrylate, 2-ethyl-2-adamantyl (meth)acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth)acrylate, tetrahydrofurfuryl (meth) acrylate, butoxyethyl (meth)acrylate, ethoxydiethylene glycol (meth)acrylate, poly(ethylene glycol) mono(meth) acrylate, poly(propylene glycol) mono(meth)acrylate, methoxyethylene glycol (meth)acrylate, ethoxyethyl (meth) acrylate, methoxy poly(ethylene glycol) (meth)acrylate, methoxy poly(propylene glycol) (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products of the monofunctional (meth)acrylic compounds include, but are not limited to, Aronix M101, M102, M110, M111, M113, M117, M5700, TO-1317, M120, M150, and M156 (manufactured by Toagosei Co., Ltd.), MEDOL-10, MIBDOL-10, CHDOL-10, MMDOL-30, MEDOL-30, MIBDOL-30, CHDOL-30, LA, IBXA, 2-MTA, HPA, and Viscoat #150, #155, #158, #190, #192, #193, #220, #2000, #2100, and #2150 (manufactured by Osaka Organic Chemical Industry Ltd.), Light Acrylate BO-A, EC-A, DMP-A, THF-A, HOP-A, HOA-MPE, HOA-MPL, PO-A, P-200A, NP-4EA, NP-BEA, and Epoxy Ester M-600A (manufactured by Kyoeisha Chemical Co., Ltd.), Kayarad TC110S, R-564, and R-128H (manufactured by Nippon Kayaku Co., Ltd.), NK ester AMP-10G and AMP-20G (manufactured by Shin Nakamura Chemical Co., Ltd.), FA-511A, 512A, and 513A (manufactured by Hitachi Chemical Co., Ltd.), PHE, CEA, PHE-2, PHE-4, BR-31, BR-31M, and BR-32 (manufactured by Dai-ichi Kogyo Seiyaku Co., Ltd.), VP (manufactured by BASF), and ACMO, DMAA, and DMAPAA (manufactured by Kohjin Co., Ltd.).

Examples of polyfunctional (meth)acrylic compounds having at least two acryloyl or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth) acrylate, tetraethylene glycol di(meth)acrylate, poly(ethylene glycol) di(meth)acrylate, poly(propylene glycol) di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris (acryloyloxy)isocyanurate, bis(hydroxymethyl) tricyclodecane di(meth)acrylate, dipentaerythritol penta (meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl) propane.

Examples of commercial products of the polyfunctional (meth)acrylic compounds include, but are not limited to, Yupimer UV SA1002 and SA2007 (manufactured by Mitsubishi Chemical Corp.), Viscoat #195, #230, #215, #260, #335HP, #295, #300, #360, #700, GPT, and 3PA (manufactured by Osaka Organic Chemical Industry Ltd.), Light Acrylate 4EG-A, 9EG-A, NP-A, DCP-A, BP-4EA, BP-4PA, TMP-A, PE-3A, PE-4A, and DPE-6A (manufactured by Kyoeisha Chemical Co., Ltd.), Kayarad PET-30, TMPTA, R-604, DPHA, DPCA-20, -30, -60, and -120, HX-620, D-310, and D-330 (manufactured by Nippon Kayaku Co., Ltd.), Aronix M208, M210, M215, M220, M240, M305, M309, M310, M315, M325, and M400 (manufactured by Toagosei Co., Ltd.), and Ripoxy VR-77, VR-60, and VR-90 (manufactured by Showa Highpolymer Co., Ltd.).

These radical polymerizable compounds may be used alone or in combination. The term "(meth)acrylate" in these compounds refers to an acrylate or its corresponding methacrylate. The term "(meth)acryloyl group" in these compounds refers to an acryloyl group or its corresponding methacryloyl group. EO denotes ethylene oxide, and EO-modified compounds refer to compounds having a block structure of an ethylene oxide group. PO denotes propylene oxide, and PO-modified compounds refer to compounds having a block structure of a propylene oxide group.

(Polymerizable Compound (A)—Cationic Polymerizable Component)

Examples of compounds having one vinyl ether group include, but are not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy poly(ethylene glycol) vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, poly(ethylene glycol) vinyl ether, chloroethyl vinyl ether, chlorobutyl vinyl ether, chloroethoxyethyl vinyl ether, phenylethyl vinyl ether, and phenoxy poly(ethylene glycol) vinyl ether.

Examples of compounds having at least two vinyl ether groups include, but are not limited to, divinyl ethers, such as ethylene glycol divinyl ether, diethylene glycol divinyl ether, poly(ethylene glycol)divinyl ether, propylene glycol divinyl ether, butylene glycol divinyl ether, hexanediol divinyl ether, bisphenol A alkylene oxide divinyl ethers, and bisphenol F alkylene oxide divinyl ethers; and other polyfunctional vinyl ethers, such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, ethylene oxide adducts of trimethylolpropane trivinyl ether, propylene oxide adducts of trimethylolpropane trivinyl ether, ethylene oxide adducts of ditrimethylolpropane tetravinyl ether, propylene oxide adducts of ditrimethylolpropane tetravinyl ether, ethylene oxide adducts of pentaerythritol tetravinyl ether, propylene oxide adducts of pentaerythritol tetravinyl ether, ethylene oxide adducts of dipentaerythritol hexavinyl ether, and propylene oxide adducts of dipentaerythritol hexavinyl ether.

Examples of compound having one epoxy group include, but are not limited to, phenyl glycidyl ether, p-tert-butylphenyl glycidyl ether, butyl glycidyl ether, 2-ethylhexylglycidyl ether, allyl glycidyl ether, 1,2-butylene oxide, 1,3-butadiene monoxide, 1,2-epoxidedecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of compounds having at least two epoxy groups include, but are not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-m-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylenebis(3,4-epoxycyclohexane), dicyclopentadiene diepoxide, ethylene glycol di(3,4-epoxycyclohexylmethyl)ether, ethylenebis(3,4-epoxycyclohexane carboxylate), epoxyhexahydrodioctyl phthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, poly(ethylene glycol)diglycidyl ether, poly(propylene glycol)diglycidyl ether, 1,1,3-tetradecadiene dioxide, limonene dioxide, 1,2,7,8-diepoxyoctane, and 1,2,5,6-diepoxycyclooctane.

Examples of compounds having one oxetanyl group include, but are not limited to, 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl)ether, isobornyloxyethyl (3-ethyl-3-oxetanylmethyl)ether, isobornyl (3-ethyl-3-oxetanylmethyl) ether, 2-ethylhexyl (3-ethyl-3-oxetanylmethyl)ether, ethyldiethylene glycol (3-ethyl-3-oxetanylmethyl)ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl)ether, tetrahydrofurfuryl (3-ethyl-3-oxetanylmethyl)ether, tetrabromophenyl (3-ethyl-3-oxetanylmethyl)ether, 2-tetrabromophenoxyethyl (3-ethyl-3-oxetanylmethyl)ether, tribromophenyl (3-ethyl-3-oxetanylmethyl)ether, 2-tribromophenoxyethyl (3-ethyl-3-oxetanylmethyl)ether, 2-hydroxyethyl (3-ethyl-3-oxetanylmethyl)ether, 2-hydroxypropyl (3-ethyl-3-oxetanylmethyl)ether, butoxyethyl (3-ethyl-3-oxetanylmethyl)ether, pentachlorophenyl (3-ethyl-3-oxetanylmethyl)ether, pentabromophenyl (3-ethyl-3-oxetanylmethyl)ether, and bornyl (3-ethyl-3-oxetanylmethyl) ether.

Examples of compounds having at least two oxetanyl groups include, but are not limited to, polyfunctional oxetanes, such as 3,7-bis(3-oxetanyl)-5-oxa-nonane, 3,3'-(1,3-(2-methylenyl)propanediylbis(oxymethylene))bis-(3-ethyl-oxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene (3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3- oxetanylmethyl)ether, pentaerythritol tetrakis(3-ethyl-3-oxetanylmethyl)ether, poly(ethylene glycol)bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl)ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, and EO-modified bisphenol F (3-ethyl-3-oxetanylmethyl)ether.

These cationic polymerizable compounds may be used alone or in combination. In these compounds, EO denotes ethylene oxide, and EO-modified compounds refer to compounds having a block structure of an ethylene oxide group. PO denotes propylene oxide, and PO-modified compounds refer to compounds having a block structure of a propylene oxide group. The term "hydrogenated", as used herein, refers to the addition of hydrogen atoms to a C=C double bond, for example, of a benzene ring.

<(B) Component: Polymerization Initiator>

The polymerization initiator (B) component of a curable composition according to an embodiment of the present invention functions as a curing aid to promote the curing of the (A) component. When the polymerizable monomer(s) of the (A) component is a radical polymerizable monomer, the polymerization initiator is a compound that produces a radical upon irradiation with light (such as infrared light, visible light, ultraviolet light, far-ultraviolet light, X-rays, a charged particle beam, such as an electron beam, or radioactive rays).

When the polymerizable compound(s) of the (A) component is a cationic polymerizable compound, the polymerization initiator is a compound that produces an acid under light irradiation.

Examples of the compound that produces a radical include, but are not limited to, optionally substituted 2,4,5-triarylimidazole dimers, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives, such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives, such as 2-benzyl-2-dimethylamino-1-(4-morpholinophenyl)-butanone-1,2-methyl-1-[4-(methylthio)phenyl]-2-morpholino-propan-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin derivatives, such as benzoin, methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine derivatives, such as N-phenylglycine; acetophenone derivatives, such as acetophenone, 3-methylacetophenone, acetophenone benzyl ketal, 1-hydroxycyclohexyl phenyl ketone, and 2,2-dimethoxy-2-phenylacetophenone; thioxanthone derivatives, such as thioxanthone, diethylthioxanthone, 2-isopropylthioxanthone, and 2-chlorothioxanthone; and xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphineoxide, and bis-(2,6-dimethoxybenzoyl)-2,4,4-trimethylpentylphosphineoxide. These compounds may be used alone or in combination.

Examples of commercial products of the compound that produces a radical upon irradiation with light include, but are not limited to, Irgacure 184, 369, 651, 500, 819, 907, 784, 2959, CGI-1700, -1750, and -1850, CG24-61, and Darocur 1116 and 1173 (manufactured by Ciba Japan K.K.), Lucirin TPO, LR8893, and LR8970 (manufactured by BASF), and Ebecryl P36 (manufactured by DAICEL-ALLNEX LTD).

Examples of the compound that produces an acid under light irradiation used as the polymerization initiator include, but are not limited to, onium salt compounds, sulfone compounds, sulfonate ester compounds, sulfonimide compounds, and diazomethane compounds. Onium salt compounds may be used in the present invention.

Examples of the onium salt compounds include, but are not limited to, iodonium salts, sulfonium salts, phosphonium salts, diazonium salts, ammonium salts, and pyridinium salts. Specific examples of the onium salt compounds include, but are not limited to, bis(4-t-butylphenyl)iodonium perfluoro-n-butane sulfonate, bis(4-t-butylphenyl)iodonium trifluoromethane sulfonate, bis(4-t-butylphenyl)iodonium 2-trifluoromethylbenzene sulfonate, bis(4-t-butylphenyl)iodonium pyrene sulfonate, bis(4-t-butylphenyl)iodonium n-dodecylbenzene sulfonate, bis(4-t-butylphenyl)iodonium p-toluene sulfonate, bis(4-t-butylphenyl)iodonium benzene sulfonate, bis(4-t-butylphenyl)iodonium 10-camphorsulfonate, bis(4-t-butylphenyl)iodonium n-octane sulfonate, diphenyliodonium perfluoro-n-butane sulfonate, diphenyliodonium trifluoromethane sulfonate, diphenyliodonium 2-trifluoromethylbenzene sulfonate, diphenyliodonium pyrene sulfonate, diphenyliodonium n-dodecylbenzene sulfonate, diphenyliodonium p-toluene sulfonate, diphenyliodonium benzene sulfonate, diphenyliodonium 10-camphorsulfonate, diphenyliodonium n-octane sulfonate, triphenylsulfonium perfluoro-n-butane sulfonate, triphenylsulfonium trifluoromethane sulfonate, triphenylsulfonium 2-trifluoromethylbenzene sulfonate, triphenylsulfonium pyrene sulfonate, triphenylsulfonium n-dodecylbenzene sulfonate, triphenylsulfonium p-toluene sulfonate, triphenylsulfonium benzene sulfonate, triphenylsulfonium 10-camphorsulfonate, triphenylsulfonium n-octane sulfonate, diphenyl(4-t-butylphenyl)sulfonium perfluoro-n-butane sulfonate, diphenyl(4-t-butylphenyl)sulfonium trifluoromethane sulfonate, diphenyl(4-t-butylphenyl)sulfonium 2-trifluoromethylbenzene sulfonate, diphenyl(4-t-butylphenyl)sulfonium pyrene sulfonate, diphenyl(4-t-butylphenyl)sulfonium n-dodecylbenzene sulfonate, diphenyl(4-t-butylphenyl)sulfonium p-toluene sulfonate, diphenyl(4-t-butylphenyl)sulfonium benzene sulfonate, diphenyl(4-t-butylphenyl)sulfonium 10-camphorsulfonate, diphenyl(4-t-butylphenyl)sulfonium n-octane sulfonate, tris(4-methoxyphenyl)sulfonium perfluoro-n-butane sulfonate, tris(4-methoxyphenyl)sulfonium trifluoromethane sulfonate, tris(4-methoxyphenyl)sulfonium 2-trifluoromethylbenzene sulfonate, tris(4-methoxyphenyl)sulfonium pyrene sulfonate, tris(4-methoxyphenyl)sulfonium n-dodecylbenzene sulfonate, tris(4-methoxyphenyl)sulfonium p-toluene sulfonate, tris(4-methoxyphenyl)sulfonium benzene sulfonate, tris(4-methoxyphenyl)sulfonium 10-camphorsulfonate, and tris(4-methoxyphenyl)sulfonium n-octane sulfonate.

Examples of the sulfone compounds include, but are not limited to, β-ketosulfones, β-sulfonylsulfones, and α-diazo compounds thereof. Specific examples of the sulfone compounds include, but are not limited to, phenacyl phenyl sulfone, mesityl phenacyl sulfone, bis(phenylsulfonyl)methane, and 4-trisphenacyl sulfone.

Examples of the sulfonate ester compounds include, but are not limited to, alkyl sulfonate esters, haloalkyl sulfonate esters, aryl sulfonate esters, and iminosulfonates. Specific examples of the sulfonate ester compounds include, but are not limited to, α-methylolbenzoin perfluoro-n-butane sulfonate, α-methylolbenzoin trifluoromethane sulfonate, and α-methylolbenzoin 2-trifluoromethylbenzene sulfonate.

Specific example of the sulfonimide compounds include, but are not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptan-5,6-oxy-2,3-dicarboxyimide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(10-camphorsulfonyloxy)bicyclo[2.2.1]heptan-5,6-oxy-2,3-dicarboxyimide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboxyimide, N-(4-methylphenylsulfonyloxy)-7-oxabicyclo[2.2.1]hept-5-ene-2,3-dicarboxyimide, N-(4-methylphenylsulfonyloxy)bicyclo[2.2.1]heptan-5,6-oxy-2,3-dicarboxyimide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboxyimide, N-(2-trifluoromethylphenylsulfonyloxy)-7-oxabicyclo[2.2.1]hept-5-ene-2,3-dicarboxyimide, N-(2-trifluoromethylphenylsulfonyloxy)bicyclo[2.2.1]heptan-5,6-oxy-2,3-dicarboxyimide, N-(2-trifluoromethylphenylsulfonyloxy)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxy)bicyclo[2.2.1]hept-5-ene-2,3-dicarboxyimide, N-(4-fluorophenylsulfonyloxy)-7-oxabicyclo[2.2.1]hept-5-ene-2,3-dicarboxyimide, N-(4-fluorophenylsulfonyloxy)bicyclo[2.2.1]heptan-5,6-oxy-2,3-dicarboxyimide, and N-(4-fluorophenylsulfonyloxy)naphthylimide.

Specific examples of the diazomethane compounds include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyldiazomethane, (cyclohexylsulfonyl)(1,1-dimethylethylsulfonyl)diazomethane, and bis(1,1-dimethylethylsulfonyl)diazomethane.

The polymerization initiator of the (B) component may be used alone or in combination.

The amount of (B) component (polymerization initiator) is preferably 0.01% by weight or more and 10% by weight or less, more preferably 0.1% by weight or more and 7% by weight or less, of the amount of (A) component (polymerizable monomer(s)). When the amount of (B) component is less than 0.01% by weight, this may result in a low curing rate and low reaction efficiency of the (A) component. When the amount of (B) component is more than 10% by weight, the resulting photo-cured product may have poor mechanical characteristics.

<Other Components>

As described above, a curable composition according to an embodiment of the present invention contains the (A) component (polymerizable monomer(s)) and the (B) component (polymerization initiator). The curable composition may contain additive components, such as an antioxidant, a solvent, and/or a polymer component, depending on the purpose without losing the advantages of the present invention.

<Temperature of Curable Composition in Preparation>

A curable composition according to an embodiment of the present invention may be prepared at a temperature in the range of 0° C. to 100° C.

<Viscosity of Curable Composition>

A curable composition according to an embodiment of the present invention has a viscosity of 40 cP or less at 23° C.

A curable composition having a viscosity of more than 40 cP may be difficult to apply using an ink jet method, which can make the residual layer thickness uniform. Furthermore, the filling time of a micropatterned depressed portion of a mold with a curable composition in a contact step (stamping step) described below increases with increasing viscosity of the curable composition. Thus, a curable composition usually has a viscosity of 20 cP or less. Since the dissolution of a condensable gas in a curable composition can reduce the viscosity of the curable composition, the curable composition can have a viscosity as high as 40 cP before the dissolution of a condensable gas without causing pattern defects due to insufficient filling. When a curable composition has a viscosity of more than 40 cP, however, this results in a long filling time and low productivity because a decrease in viscosity due to the dissolution of a condensable gas is insufficient. When a curable composition has a viscosity of less than 1 cP, this unfavorably results in uneven application (arrangement) of the curable composition or an outflow of the curable composition from a mold in the contact step described below.

<Surface Tension of Curable Composition>

In the present embodiment, a curable composition preferably has a surface tension in the range of 5 to 70 mN/m, more preferably 7 to 35 mN/m, particularly preferably 10 to 32 mN/m, at 23° C. A surface tension of less than 5 mN/m results in a low capillary force and consequently a long filling time of a depressed portion of a mold with the curable composition in the contact step (stamping step) described below. On the other hand, a surface tension of more than 70 mN/m results in a high contact angle of the curable composition on a substrate and a long filling time of the space between the substrate and a mold because of low spreadability of the curable composition on the substrate.

<Removal of Foreign Substances, Such as Particles>

After the components of a curable composition described above are mixed, the curable composition can be passed through a filter, for example, having a pore size in the range of 1.0 nm to 5.0 µm to remove foreign substances, such as particles. Particles in a curable composition may become obstacles in the formation of intended asperities on a cured product. A curable composition may be filtered in multiple steps or may be repeatedly filtered. A curable composition stored in an application apparatus may be steadily filtered. The material of a filter for use in the filtration of a curable composition may be, but is not limited to, a polyethylene resin, a polypropylene resin, a fluoropolymer, or a nylon resin.

When a cured product produced using a method according to the present embodiment is used in the manufacture of a semiconductor integrated circuit, in order to prevent the operation of the product to be interfered, a curable composition before curing may be filtered to remove metal impurities. Thus, the allowable concentration of metal impurities in a curable composition is preferably 10 ppm or less, more preferably 100 ppb or less.

(Imprinting Method)

An imprinting method according to the present embodiment is a method for producing a cured product having a predetermined pattern on a substrate and includes a step of bringing a mold into contact with a curable composition in a condensable gas atmosphere.

The embodiments described below include at least the following steps (1) to (5):

(1) an arranging step of arranging a curable composition for imprinting on a substrate, (2) a step of supplying a condensable gas between the curable composition for imprinting and a mold, (3) a contact step of bringing the curable composition for imprinting into contact with the mold in the condensable gas atmosphere, (4) a photoirradiation step of irradiating the curable composition for imprinting with light, and (5) a demolding step of removing the mold from the curable composition for imprinting.

An imprinting method according to the present embodiment is a manufacturing process utilizing an UV imprinting method and can produce a photo-cured product having a nano-level pattern.

The specific manufacturing process of a manufacturing method according to the present embodiment will be described below with reference to the drawings. FIGS. 1A to 1G are schematic cross-sectional views of each step of producing a photo-cured product and a circuit board in accordance with a manufacturing method according to the present embodiment. The manufacturing process illustrated in FIGS. 1A to 1G include the following steps (i) to (vi) or (vii).

(i) an arranging step (FIG. 1A)
(ii) a condensable gas supply step (FIG. 1B)
(iii) a contact step (stamping step, FIGS. 1C1 and 1C2)
(iv) a photoirradiation step (FIG. 1D)
(v) a demolding step (FIG. 1E)
(vi) an etching step (residual film removal step, FIG. 1F)
(vii) a substrate processing step (FIG. 1G)

Through these steps, a photo-cured product 11 and an electronic component (electronic device) or an optical component including the photo-cured product 11 can be produced from a curable composition 1. These steps will be described in detail below.

(i) Placing Step (FIG. 1A)

First, the curable composition 1 for imprinting is arranged on a substrate 2 (FIG. 1A). Since the curable composition 1 is a liquid, this step is also referred to as an application step.

The substrate 2 used in this step can be appropriately selected for the application purpose of the photo-cured product 11 produced using the manufacturing method according to the present embodiment. More specifically, when the photo-cured product 11 is used as a mask for use in substrate processing, the substrate 2 in FIG. 1A may be a substrate for semiconductor devices. The substrate for semiconductor devices may be a silicon wafer substrate. Instead of the silicon wafer substrate, the substrate for semiconductor devices may be an aluminum, titanium-tungsten alloy, aluminum-silicon alloy, aluminum-copper-silicon alloy, silicon oxide, or silicon nitride substrate. These substrates may be subjected to surface treatment, such as silane coupling treatment, silazane treatment, or organic material deposition, in order to improve the adhesion between the curable composition 1 and the substrate 2.

When the photo-cured product 11 is transparent, the photo-cured product 11 may be used as an optical member. In such a case, the substrate 2 may be an optically transparent substrate, such as a glass substrate.

As illustrated in FIG. 1A, the curable composition 1 is arranged on (applied to) the substrate 2, for example, using an ink jet method, a dip coating method, an air knife coating method, a curtain coating method, a wire bar coating method, a gravure coating method, an extrusion coating method, a spin coating method, or a slit scanning method.

The arrangement of the curable composition 1 for imprinting on the substrate 2 may be the following (i-1) or (i-2). Although the present invention is not limited to these arrangements, the arrangement (i-1) can make the residual layer thickness uniform for each pattern.

(i-1) Arrangement of discrete portions of the curable composition 1

(i-2) Arrangement of the curable composition 1 over the entire surface of the substrate 2

For the arrangement (i-1), discrete droplets of the curable composition may be arranged on the substrate using an ink jet method. The ink jet method allows droplets to fly from a noncontact ejection port to the substrate and to be arranged in a desired pattern in a precise amount. This can make the residual layer thickness between the mold and the substrate more uniform in the contact step described below.

The size of droplets of the curable composition 1 arranged on (applied to) the substrate 2 may be in the micron or submicron range.

For the arrangement (i-2), the film thickness of the curable composition 1 arranged on (applied to) the substrate 2 varies with the application purpose and may be in the range of 1.0 nm to 100.0 µm.

(ii) Condensable Gas Supply Step (FIG. 1B)

In order to form a condensable gas atmosphere around the curable composition 1 for imprinting arranged on the substrate 2, a condensable gas 3 is supplied onto the substrate 2 (FIG. 1B).

The term "condensable gas", as used herein, refers to a gas that is in a gas state at the temperature and pressure for a manufacturing apparatus for producing a photo-cured product having a desired pattern and is condensed (liquefied) under given conditions in the contact step (stamping step) described below. The given conditions will be described later.

In the present embodiment, the condensable gas may have a boiling point in the range of −10° C. to 23° C. at atmospheric pressure or may have a saturated vapor pressure in the range of 0.1 to 0.4 MPa at normal temperature (23° C.). A gas having a saturated vapor pressure in the range of 0.1 to 0.4 MPa at normal temperature can be easily liquefied only by pressing the mold 4 against the substrate 2 at a pressure in the range of 0.1 to 0.4 MPa.

A gas having a saturated vapor pressure of more than 0.4 MPa at normal temperature requires a pressure of more than 0.4 MPa for liquefaction. This unfavorably increases the time to reduce the gas volume by liquefaction or produces a high pressure on a mask or the substrate, causing deformation of the mask or the substrate and reducing alignment precision.

Use of a gas having a saturated vapor pressure of less than 0.1 MPa at normal temperature requires a reduced pressure in an imprinting apparatus before the stamping step in order that the gas can be in a gas state at normal temperature. This unfavorably makes the imprinting apparatus complicated.

In general, the imprinting region of a photo-curing imprinting apparatus is used at normal temperature (23° C.). A gas having a boiling point lower than the temperature of the imprinting region can be liquefied by reducing the temperature of the imprinting region. A gas having a boiling point higher than the temperature of the imprinting region is a liquid at normal temperature. In order to reduce the volume of the gas by liquefaction, therefore, the temperature of the imprinting apparatus must be temporarily increased to the boiling point or higher and is then decreased. This unfavorably makes the imprinting apparatus complicated.

Specific examples of the condensable gas include, but are not limited to, fluorocarbons, such as chlorofluorocarbon (CFC), fluorocarbon (FC), hydrochlorofluorocarbon (HCFC), hydrofluorocarbon (HFC), and hydrofluoroether (HFE).

The condensable gas may be 1,1,1,3,3-pentafluoropropane ($CHF_2CH_2CF_3$, HFC-245fa, PFP). 1,1,1,3,3-pentafluoropropane has a saturated vapor pressure of 0.14 MPa at room temperature (23° C.) and a boiling point of 15° C.

These condensable gases may be used alone or in combination. These condensable gases may be mixed with a noncondensable gas, such as air, nitrogen, carbon dioxide, helium, or argon.

In this step (condensable gas supply step), a predetermined amount of condensable gas 3 in a gas state is supplied to the vicinity of the curable composition 1 on the substrate 2 at a pressure lower than the saturated vapor pressure of the condensable gas 3 or at a temperature higher than the boiling point of the condensable gas 3.

(iii) Contact Step (FIGS. 1C1 and 1C2)

The mold 4 is then brought into contact with the curable composition 1 for imprinting (FIGS. 1C1 and 1C2). This step is also referred to as an stamping step. Since the curable composition 1 in the upstream step (condensable gas supply step) is in the atmosphere of the condensable gas 3, this step (contact step) is performed in the atmosphere of the condensable gas 3.

As illustrated in FIG. 1C1, when the mold 4 is in contact with the curable composition 1, because of capillary force, the curable composition 1 penetrates between the substrate 2 and the mold 4 and into depressed portions (micropattern) of the mold 4. The condensable gas 3 between the substrate 2 and the mold 4 and in the depressed portions of the mold 4 is pressed by the curable composition 1 and is liquefied at the temperature of this step. Thus, the volume of the condensable gas 3 between the substrate 2 and the mold 4 and in the depressed portions of the mold 4 approaches zero, and no air bubble is formed in a micropattern 10 of the curable composition. This prevents the formation of a cured product having an unintended shape and improves pattern transfer accuracy.

Figure 2B:
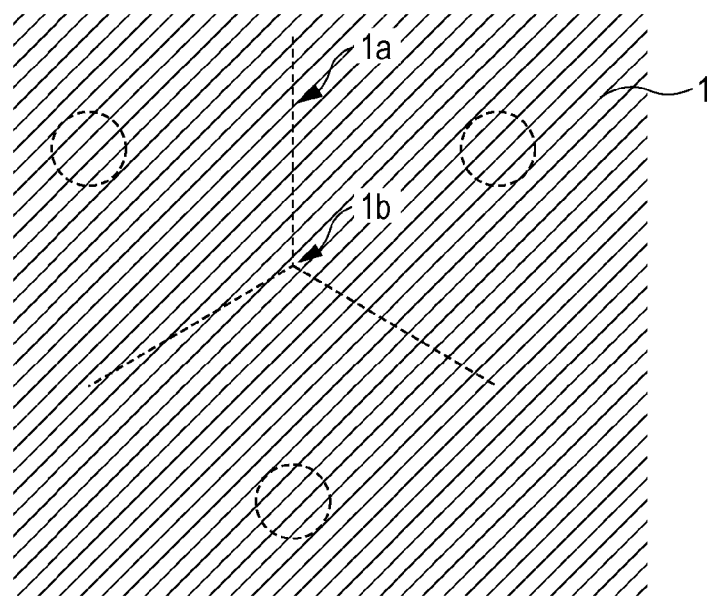

FIGS. 2A and 2B are plan views of discrete portions of the curable composition 1. FIG. 2A illustrates the state of the curable composition in the arranging step, and FIG. 2B illustrates the state of the curable composition in the contact step.

When three droplets of the curable composition 1 in FIG. 2A are brought into contact with a mold (not shown), the droplets move under the molding pressure and capillary force. The condensable gas at a contact portion 1a between spreading two droplets and a contact portion 1b between spreading three droplets is liquefied under the molding pressure and capillary force. Thus, air bubbles are rarely formed at the contact portions 1a and 1b. Consequently, a photo-cured product having a desired pattern can be formed with a minimum amount of curable composition 1.

The mold 4 in this step is made of an optically transparent material, for example, glass, quartz, an optically transparent resin, such as PMMA or polycarbonate resin, a transparent metallized film, a soft film, such as a polydimethylsiloxane film, a photo-cured film, or a metal film.

The mold may be subjected to surface treatment in order to improve the releasability of the mold from the curable composition for imprinting. The surface treatment may be performed using a silicone or fluorinated silane coupling agent or a coating-type mold-release agent. A commercially available coating-type mold-release agent, such as Optool DSX manufactured by Daikin Industries, Ltd., may be used.

More specifically, a coating-type mold-release agent may be applied to a patterned surface of the mold 4 before this step (the contact step or stamping step) to form a mold-release layer. Examples of the coating-type mold-release agent include, but are not limited to, silicon mold-release agents, fluorinated mold-release agents, polyethylene mold-release agents, polypropylene mold-release agents, paraffinic mold-release agents, montan mold-release agents, and carnauba mold-release agents. The coating-type mold-release agent may be a fluorinated mold-release agent. These mold-release agents may be used alone or in combination.

The mold 4 is pressed against the curable composition 1 at any pressure that is higher than the saturated vapor pressure of the condensable gas. Although the contact time is not particularly limited, an excessively short contact time results in insufficient penetration of the curable composition 1 between the substrate 2 and the mold 4 and into the depressed portions (micropattern) of the mold 4. An excessively long contact time reduces productivity.

(iv) Photoirradiation Step (FIG. 1D)

A curable composition 10 for imprinting having a desired pattern in contact with the mold 4 is then irradiated with light (FIG. 1D). The curable composition 10 having a pattern corresponding to the asperity pattern on the surface of the mold 4 is cured and forms a photo-cured product 11.

In this step, the curable composition 10 may be irradiated with any type of light that is selected in accordance with the sensitive wavelength of the photo-curable composition 10. For example, the light may be ultraviolet light having a wavelength in the range of approximately 150 to 400 nm, X-rays, or an electron beam. Various photosensitive compounds sensitive to ultraviolet light are easily available as the polymerization initiator ((B) component) in the curable composition 10. Examples of ultraviolet light sources include, but are not limited to, high-pressure mercury lamps, ultrahigh-pressure mercury lamps, low-pressure mercury lamps, deep-UV lamps, carbon arc lamps, chemical lamps, metal halide lamps, xenon lamps, KrF excimer lasers, ArF excimer lasers, and $F_2$ excimer lasers. These light sources may be used alone or in combination. In this step, the curable composition 10 may be entirely or partly irradiated with light.

If possible, the curable composition 10 may further be cured with heat. The heating atmosphere and the heating temperature of heat curing are not particularly limited and may be an inert atmosphere or under reduced pressure and in the range of 40° C. to 200° C. Heating may be performed with a hot plate, an oven, or a furnace.

(v) Demolding Step (FIG. 1E)

The mold is then removed from the curable composition for imprinting (FIG. 1E). Inversions of the surface asperities of the mold 4 are formed on the resulting photo-cured product 11.

In the present embodiment, the mold may be removed from the curable composition using any method under any conditions. For example, the mold 4 is moved away from the substrate 2 while the substrate 2 is fixed, the substrate 2 is moved away from the mold 4 while the mold 4 is fixed, or the substrate 2 and the mold 4 are moved in mutually opposite directions.

At the end of this step, the photo-cured product 11 having a reverse pattern of the surface asperities of the mold 4 is formed on at least part of the substrate 2. The pattern size of the asperity pattern on the photo-cured product 11 reflects the pattern size of the asperity pattern on the mold 4. The asperity pattern on the mold 4 may have any pattern size. More specifically, the asperity pattern on the mold 4 may have a pattern size on the order of millimeters, micrometers (including submicron), or nanometers. In accordance with the manufacturing method of the present embodiment, for example, the asperity pattern in the nano scale may have a pattern size of 20 nm or less.

When the mold 4 has a smaller area than the substrate 2, part of the curable composition 1 on the substrate 2 is not in contact with the mold 4. In such a case, the process including the arranging step, the contact step, the photoirradiation step, and the demolding step is performed in a plurality of regions on the substrate 2 while the mold 4 is moved to each of the regions. Thus, a plurality of photo-cured products 11 having the asperity pattern of the mold 4 can be formed on the substrate 2.

(vi) Etching Step (Residual Film Removal Step, FIG. 1F)

The cured product 11 of the curable composition for imprinting after the demolding step has a thin-film cured product (residual film) on the depressed portions thereof. The cured product 11 in the depressed portions is removed in this etching step (FIG. 1F). The portions of the substrate 2 corresponding to the depressed portions of the photo-cured product 11 are exposed in this step.

Etching in this step may be performed with any method, including a known method, for example, dry etching. A known dry etching apparatus may be used in dry etching. The source gas for dry etching depends on the elementary composition of the photo-cured product 11 to be etched and may be an oxygen-containing gas, such as $O_2$, CO, or $CO_2$, an inert gas, such as He, $N_2$, or Ar, a chlorine gas, such as $Cl_2$ or $BCl_3$, $H_2$, or $NH_3$. These gases may be used alone or in combination.

Through these steps (i) to (vi), the photo-cured product 11 having a desired asperity pattern (corresponding to the asperities of the mold 4) can be produced. When the substrate 2 is processed utilizing the photo-cured product 11, the substrate processing step may be performed as described below.

The photo-cured product 11 may also be used as an optical element (including use as a member of the optical element). In such a case, the optical component includes at least the substrate 2 and the photo-cured product 11 disposed on the substrate 2.

(vii) Substrate Processing Step (FIG. 1G)

The photo-cured product 11 having a desired asperity pattern produced using the manufacturing method according to the present embodiment can be used as a film for an interlayer insulating film in electronic components, for example, semiconductor devices, such as LSIs, system LSIs, DRAMs, SDRAMs, RDRAMs, and D-RDRAMs. The photo-cured product 11 may also be used as a resist film in the manufacture of semiconductor devices. The photo-cured product 11 may also be used in the manufacture of various components, such as components of microchannel devices.

When the photo-cured product 11 is used as a resist film, the exposed portions formed in the etching step are subjected to etching or ion implantation, as illustrated in FIG. 1G. A circuit 20 corresponding to the pattern of the photo-cured product 11 can be formed on the substrate 2. A circuit board for use in semiconductor devices can be manufactured through these steps. An electronic component (electronic device) can be manufactured by mounting electronic components on the substrate 2 having the circuit 20 illustrated in FIG. 1G.

Finally, the pattern of the photo-cured product 11 may be removed from the processed substrate 2 or may be left as a member for constituting electronic components.

EXAMPLES

The present invention will be further described in the following examples. However, the technical scope of the present invention is not limited to these examples. Unless otherwise specified, "part" and "%" are based on weight.

Reference Example

Demonstration Experiment Related to First and Second Embodiments: Measurement of Maximum Condensable Gas Solubility, Part 1

Three grams of each of the following (meth)acrylate monomers 1) to 10) was weighed into a 9-ml brown bottle.

1) isobornyl acrylate (IBOA), trade name IB-XA (Kyoeisha Chemical Co., Ltd.) (1)

2) 1-adamantyl methacrylate (ADMA), trade name ADMA (Osaka Organic Chemical Industry Ltd.) (2)

3) 2-methyl-2-adamantyl methacrylate (MADMA), trade name MADMA (Osaka Organic Chemical Industry Ltd.) (3)

4) hexanediol diacrylate (HDODA), trade name V#230 (Osaka Organic Chemical Industry Ltd.) (4)

5) dimethyloltricyclodecane diacrylate (DCPDA), trade name DCP-A (Kyoeisha Chemical Co., Ltd.) (5)

6) 1,3-adamantanedimethanol diacrylate (ADDA), trade name A-201 (Idemitsu Kosan Co. Ltd.) (6)

7) a monomer mixture of 25% by weight MADMA and 75% by weight HDODA (7)

8) a monomer mixture of 50% by weight MADMA and 50% by weight HDODA (8)

9) a monomer mixture of 75% by weight MADMA and 25% by weight HDODA (9)

10) 2-ethyl-2-adamantyl acrylate (EtADA), trade name EtADA (Osaka Organic Chemical Industry Ltd.) (10)

1,1,1,3,3-pentafluoropropane (PFP) was used as a condensable gas to determine the maximum condensable gas solubility (gas/(curable composition+gas)) (g/g) of the (meth)acrylate monomers.

The maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas.

Figure 3:
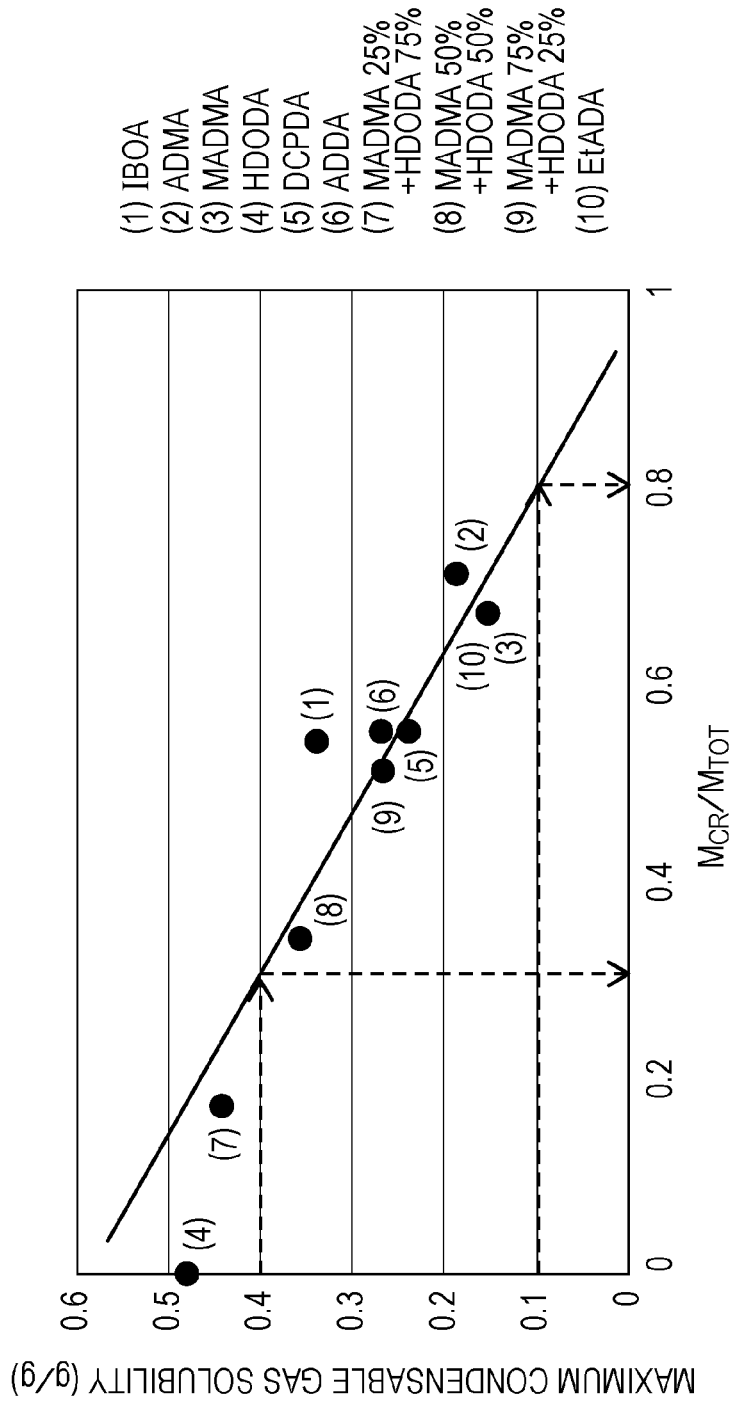
FIG. 3 is a graph of the correlation between maximum condensable gas solubility and $M_{CR}/M_{TOT}$ according to an embodiment of the present invention.

FIG. 3 is a graph of the correlation between the amount of carbon of the ring structure of each monomer component and the maximum condensable gas solubility. When the amount of carbon $M_{CR}$ of the ring structure and the total amount of carbon $M_{TOT}$ of the (A) component satisfy $0.3 < M_{CR}/M_{TOT} \leq 0.8$, the maximum condensable gas solubility was found to be $0.1 \leq$ maximum condensable gas solubility $\leq 0.4$.

Figure 4:
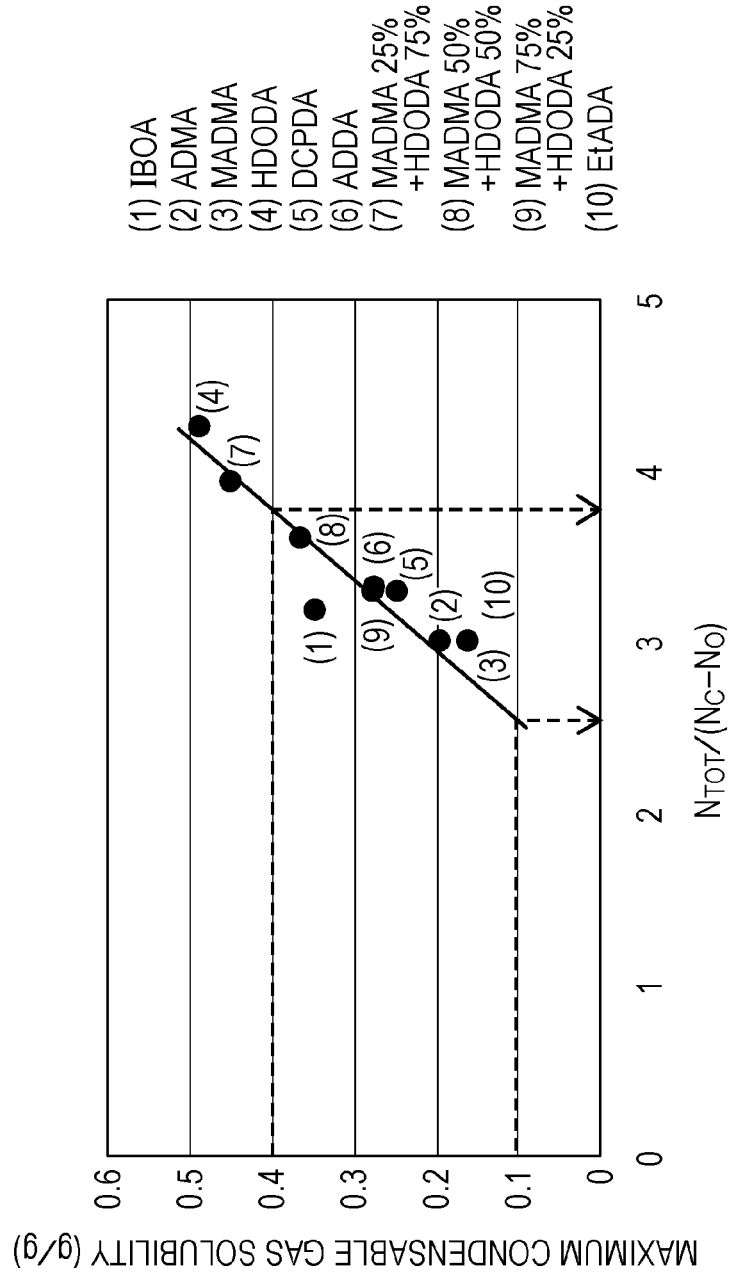
FIG. 4 is a graph of the correlation between maximum condensable gas solubility and $N_{TOT}/(N_C-N_O)$ according to an embodiment of the present invention.
Figure 5:
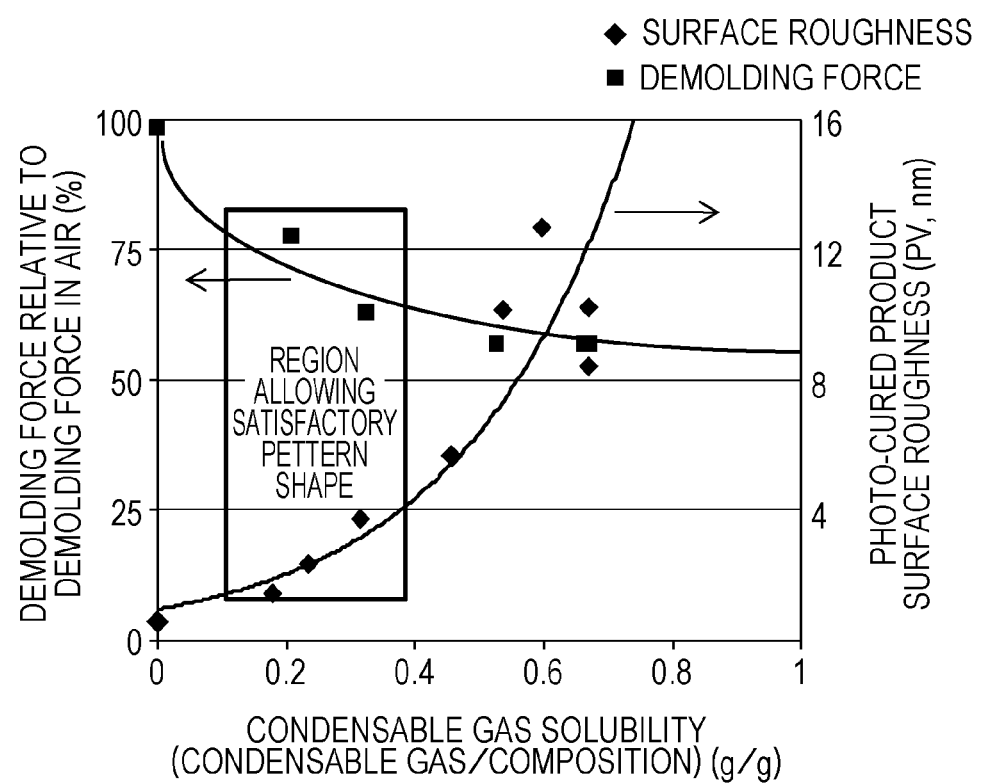
FIG. 5 is a graph of the relationship between condensable gas solubility, demolding force, and surface roughness.

As illustrated in FIG. 4, when the relationship between the total number of atoms $N_{TOT}$, the total number of carbon atoms $N_C$, and the total number of oxygen atoms $N_O$ of the (A) component satisfies the formula (mathematical formula 2) $2.5 < N_{TOT}/(N_C - N_O) < 3.8$, the maximum condensable gas solubility was found to be $0.1 <$ maximum condensable gas solubility $< 0.4$. Instead of 1,1,1,3,3-pentafluoropropane (PFP), 1H-nonafluorobutane ($CHF_2CF_2CF_2CF_3$, b.p. 14° C.) and 2H-nonafluorobutane ($CF_3CHFCF_2CF_3$, b.p. 15° C.) were used as condensable gases. The same measurement as described above showed that the maximum condensable gas solubility was $0.1 \leq$ maximum condensable gas solubility $\leq 0.4$ for $0.3 < M_{CR}/M_{TOT} \leq 0.8$. These condensable gases have a boiling point in the range of −10° C. to 23° C. at atmospheric pressure or a saturated vapor pressure in the range of 0.1 to 0.4 MPa at normal temperature (23° C.)

Demonstration Experiment Related to Third Embodiment: Measurement of Maximum Condensable Gas Solubility, Part 2

Three grams of each of the following (meth)acrylate monomers 1) to 16) was weighed into a 9-ml brown bottle.

1) isobornyl acrylate (IBOA), trade name IB-XA (Kyoeisha Chemical Co., Ltd.) (1)

2) 1-adamantyl methacrylate (ADMA), trade name ADMA (Osaka Organic Chemical Industry Ltd.) (2)

3) 2-methyl-2-adamantyl methacrylate (MADMA), trade name MADMA (Osaka Organic Chemical Industry Ltd.) (3)

4) hexanediol diacrylate (HDODA), trade name V#230 (Osaka Organic Chemical Industry Ltd.) (4)

5) dimethyloltricyclodecane diacrylate (DCPDA), trade name DCP-A (Kyoeisha Chemical Co., Ltd.) (5)

6) 1,3-adamantanedimethanol diacrylate (ADDA), trade name A-201 (Idemitsu Kosan Co. Ltd.) (6)

7) 2-ethyl-2-adamantyl acrylate (EtADA), trade name EtADA (Osaka Organic Chemical Industry Ltd.) (7)

8) 2-methyl-2-adamantyl acrylate (MADA), trade name MADA (Osaka Organic Chemical Industry Ltd.) (8)

9) dicyclopentanyl acrylate (DCPA), trade name FA-513AS (Hitachi Chemical Co., Ltd.) (9)

10) 2-hydroxyethyl acrylate (HEA), trade name HEA (Osaka Organic Chemical Industry Ltd.) (10)

11) dodecyl acrylate or lauryl acrylate (LA), trade name LA (Osaka Organic Chemical Industry Ltd.) (11)

12) octadecyl acrylate or stearyl acrylate (STA), trade name STA (Osaka Organic Chemical Industry Ltd.) (12)

13) isooctadecyl acrylate or isostearyl acrylate (ISTA), trade name ISTA (Osaka Organic Chemical Industry Ltd.) (13)

14) phenoxyethyl acrylate (PhEA), trade name V#192 (Osaka Organic Chemical Industry Ltd.) (14)

15) 1,9-nonanediol diacrylate (NDODA), trade name A-NOD-N(Shin Nakamura Chemical Co., Ltd.) (15)

16) 1,10-decanediol diacrylate (DDODA), trade name A-DOD-N(Shin Nakamura Chemical Co., Ltd.) (16)

1,1,1,3,3-pentafluoropropane (PFP) was used as a condensable gas to determine the maximum condensable gas solubility (gas/(curable composition+gas)) (g/g) of the (meth)acrylate monomers.

The maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas.

Figure 6:
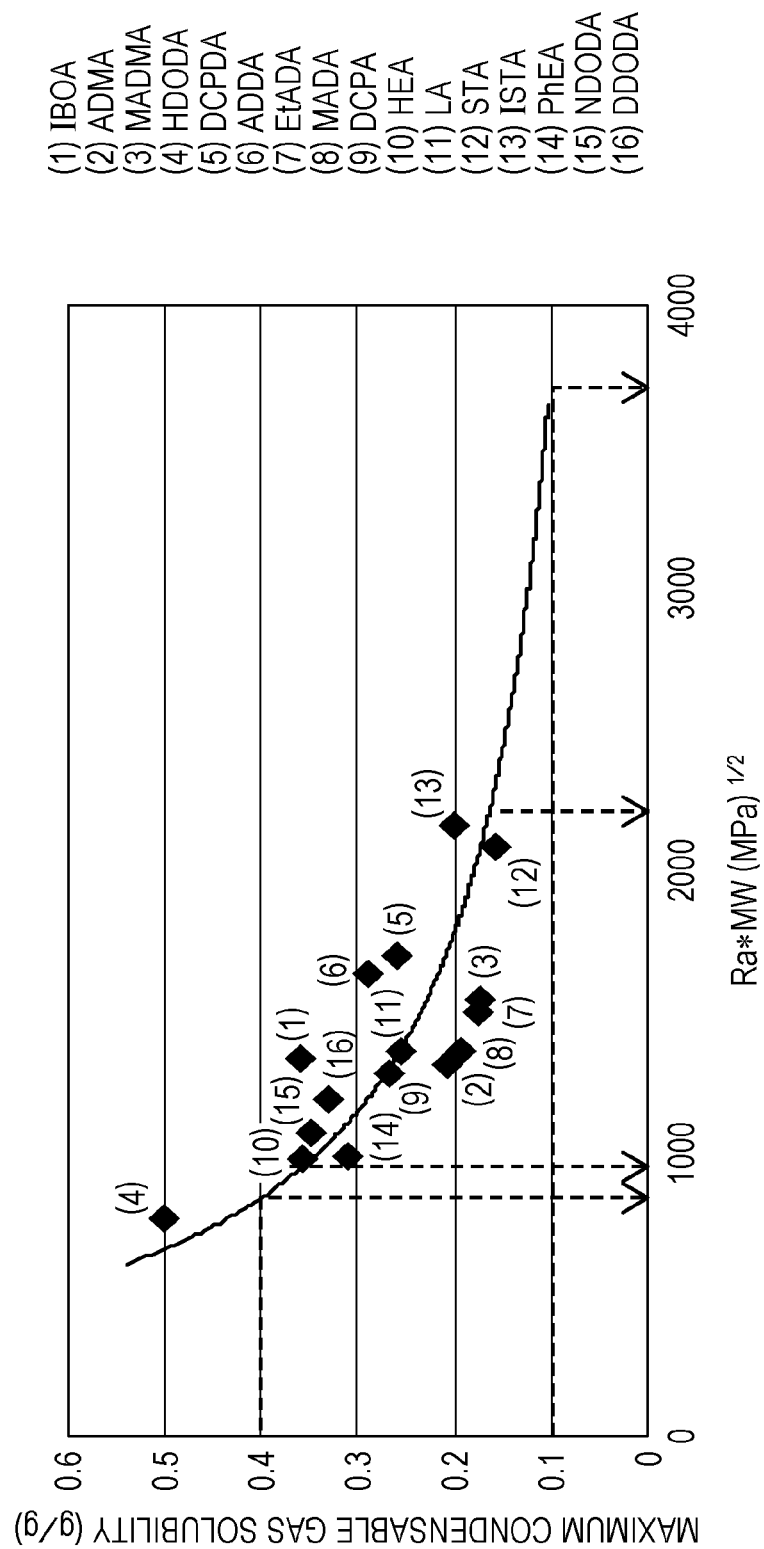
FIG. 6 is a graph of the correlation between maximum condensable gas solubility and Ra*MW according to an embodiment of the present invention. Ra*MW is the product of the Hansen distance and the molecular weight of a monomer.

FIG. 6 is a graph of the correlation between Ra*MW and the maximum condensable gas solubility of the monomers. Ra*MW is the product of the Hansen distance (Ra) between 1,1,1,3,3-pentafluoropropane and the monomers and the molecular weight (MW) of the monomers.

The Hansen distance (Ra) is defined by the following formula (mathematical formula 4):

$$Ra = (4(\delta_{dm}-16)^2 + (\delta_{pm}-3)^2 + (\delta_{hm}-9)^2)^{1/2} \quad \text{(mathematical formula 4)}$$

wherein the Hansen solubility parameters (dispersion, polarity, and hydrogen bonding) of 1,1,1,3,3-pentafluoropropane are 16, 3, and 9 [$(MPa)^{1/2}$], and $\delta_{dm}$, $\delta_{pm}$, and $\delta_{hm}$, [$(MPa)^{1/2}$] denote the Hansen solubility parameters (dispersion, polarity, and hydrogen bonding) of the monomers. The Hansen solubility parameters of the monomers are calculated values of software Hansen Solubility Parameters in Practice (HSPiP) 4th Edition. 4.0.05, which calculates the Hansen solubility parameter from the chemical structure of the monomer. The definition and calculation of the Hansen solubility parameter are described in Charles M. Hansen, Hansen Solubility Parameters: A Users Handbook (CRC press, 2007). Computer software Hansen Solubility Parameters in Practice (HSPiP) can be used to conveniently calculate the Hansen solubility parameter from the chemical structure.

When the product Ra*MW of the Hansen distance (Ra) between 1,1,1,3,3-pentafluoropropane and the monomers and the molecular weight (MW) of the monomers is 800<Ra*MW<3800, the maximum condensable gas solubility was found to be $0.1 \leq$ maximum condensable gas solubility $\leq 0.4$. Instead of 1,1,1,3,3-pentafluoropropane (PFP), 1H-nonafluorobutane ($CHF_2CF_2CF_2CF_3$, b.p. 14° C.) and 2H-nonafluorobutane ($CF_3CHFCF_2CF_3$, b.p. 15° C.) were used as condensable gases. The same measurement as described above showed that the maximum condensable gas solubility was $0.1 \leq$ maximum condensable gas solubility $\leq 0.4$ for 800<Ra'*MW$\leq$3800. These condensable gases have a boiling point in the range of −10° C. to 23° C. at atmospheric pressure or a saturated vapor pressure in the range of 0.1 to 0.4 MPa at normal temperature (23° C.)

The Hansen distance (Ra') is defined by the following formula (mathematical formula 7):

$$Ra' = (4(\delta_{dm}-\delta_{df})^2 + (\delta_{pm}-\delta_{pf})^2 + (\delta_{hm}-\delta_{hf})^2)^{1/2} \quad \text{(mathematical formula 7)}$$

wherein $\delta_{dm}$, $\delta_{pm}$, and $\delta_{hm}$ [$(MPa)^{1/2}$] denote the Hansen solubility parameters (dispersion, polarity, and hydrogen bonding) of the monomer, and $\delta_{df}$, $\delta_{pf}$, and $\delta_{hf}$ [(MPa)$^{1/2}$] denote the Hansen solubility parameters (dispersion, polarity, and hydrogen bonding) of the condensable gas. The Hansen solubility parameters of the monomers are calculated values of software Hansen Solubility Parameters in Practice (HSPiP) 4th Edition. 4.0.05, which calculates the Hansen solubility parameter from the chemical structure of the monomer.

The Hansen solubility parameters of the condensable gas are determined from the Hansen solubility parameters of five fluorine-free liquids and the solubility of the condensable gas in the five liquids. The five liquids being isobornyl acrylate, 1,6-hexanediol diacrylate, cyclohexanone, n-butyl acetate, and propylene glycol monomethyl ether acetate.

Demonstration Experiment Related to Fourth Embodiment

<Measurement of Viscosity>

The viscosities of the following (meth)acrylate monomers 1) and 2) and reference (meth)acrylate monomers 3) and 4) were measured with a digital viscometer LVDV-E (manufactured by Brookfield Engineering Laboratories). These monomers have the structural formulae (Chem. 4) to (Chem. 7).

1) 1,9-nonanediol diacrylate (NDODA), trade name A-NOD-N (Shin Nakamura Chemical Co., Ltd.) (Chem. 4)

2) 1,10-decanediol diacrylate (DDODA), trade name A-DOD-N(Shin Nakamura Chemical Co., Ltd.) (Chem. 5)

3) 1-acryloxy-2-hydroxyl-3-methacryloxypropane (Chem. 6)

4) dipropenoic acid (1-methyl-1,2-ethanediyl)bis[oxy(2-hydroxy-3,1-propanediyl)]ester (Chem. 7)

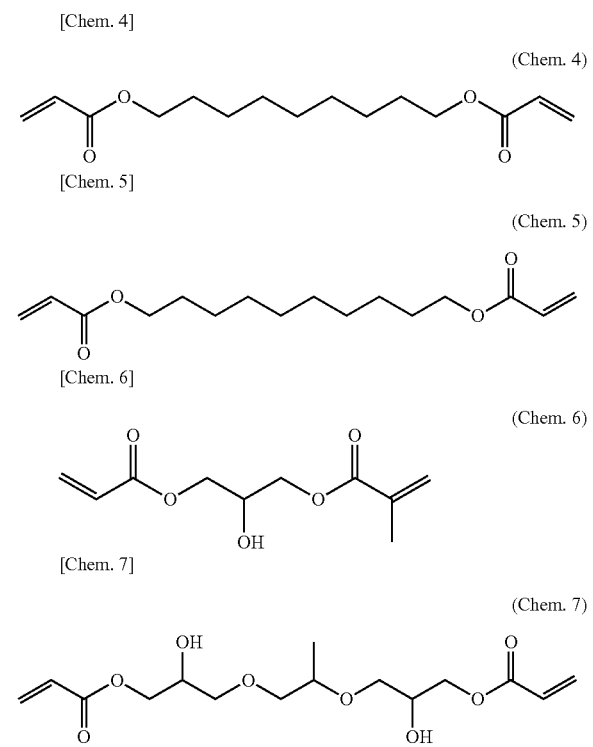

Table 1 lists the molecular formula and viscosity of the monomers. The viscosities of the monomers according to the present embodiment were lower than 40 cP.

TABLE 1

This table lists the (A) component having the general formula (Chem. 1) according to an embodiment of the present invention and the viscosity thereof.

| Chemical formula | Molecular formula | R | Present embodiment | Viscosity (cP) |
|---|---|---|---|---|
| (Chem. 4) | C15H24O4 | C9H18 | Yes | 8 |
| (Chem. 5) | C16H26O4 | C10H20 | Yes | 9 |
| (Chem. 6) | C10H14O5 | C4H8O | No | 44 |
| (Chem. 7) | C15H24O8 | C9H18O4 | No | 1231 |

<Measurement of Maximum Condensable Gas Solubility>

Three grams of each of the (meth)acrylate monomers 1) and 2) and the following (meth)acrylate monomers 5) and 6) was weighed into a 9-ml brown bottle.

5) neopentyl glycol diacrylate (NPDA), trade name N-AP (Kyoeisha Chemical Co., Ltd.)

6) hexanediol diacrylate (HDODA), trade name V#230 (Osaka Organic Chemical Industry Ltd.)

1,1,1,3,3-pentafluoropropane (PFP) was used as a condensable gas to determine the maximum condensable gas solubility (gas/(curable composition+gas)) (g/g) of the (meth)acrylate monomers.

The maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas.

FIG. 8 is a graph of the correlation between the maximum condensable gas solubility and n in the general formula (Chem. 1) of the (A) component.

The condensable gas solubility decreased with increasing n.

Instead of 1,1,1,3,3-pentafluoropropane (PFP), 1H-nonafluorobutane (CHF$_2$CF$_2$CF$_2$CF$_3$, b.p. 14° C.) and 2H-nonafluorobutane (CF$_3$CHFCF$_2$CF$_3$, b.p. 15° C.) were used as condensable gases. The same measurement as described above showed that the condensable gas solubility decreased with increasing n.

The correlation between n in the general formula (Chem. 1) of the (A) component and the condensable gas solubility in FIG. 8 shows that the maximum condensable gas solubility was ≤0.4 when n in the general formula (Chem. 1) was 9 or more. More specifically, when the (A) component is a single monomer having the general formula (Chem. 1), n may be 9 or more. When the (A) component is composed of a plurality of monomers, the ratio of the monomers is determined such that the maximum condensable gas solubility is ≤0.4.

Instead of 1,1,1,3,3-pentafluoropropane (PFP), 1H-nonafluorobutane (CHF$_2$CF$_2$CF$_2$CF$_3$, b.p. 14° C.) and 2H-nonafluorobutane (CF$_3$CHFCF$_2$CF$_3$, b.p. 15° C.) were used as condensable gases. The same measurement as described above showed that the maximum condensable gas solubility was 0.4 when n in the general formula (Chem. 1) was 9 or more. These condensable gases have a boiling point in the range of −10° C. to 23° C. at atmospheric pressure or a saturated vapor pressure in the range of 0.1 to 0.4 MPa at normal temperature (23° C.)

<n in General Formula (Chem. 1) and Calculation of Melting Point and Viscosity of Monomer>

A linear alkyl monomer having the general formula (Chem. 1) in which n is 21 is shown in (Chem. 8). The melting points of monomers having the general formula (Chem. 1) in which n is in the range of 11 to 24 were calculated using commercially available software Hansen Solubility Parameters in Practice (HSPiP). Table 2 lists n and the calculation results of the melting point and viscosity at 23° C. Although the melting point was less than 23° C. when n was as high as 21, the melting point was 23° C. or more indicative of a solid state when n was 12, 16, 18, or 20. Monomers having the general formula (Chem. 1) in which R has a branched structure and n is 20 or 21 are shown in the structural formula (Chem. 9) and the structural formula (Chem. 10). The melting point and viscosity calculated as described above are listed in Table 2. The melting points were −13.6° C. and −16.3° C. indicative of a liquid state at 23° C. Even in a solid linear compound, introduction of branched R tends to reduce the melting point without significant increase in viscosity. Although the present embodiment is characterized by the fact that the (A) component is in a liquid state when n in the general formula (Chem. 1) is 21 or less, n may be 22 or more if the (A) component having a branched structure is in a liquid state at 23° C. and has a viscosity of 40 cP or less.

TABLE 2

This table lists the (A) component having the general formula (Chem. 1) according to an embodiment of the present invention and the melting point and viscosity thereof.

| Chemical formula | n | Melting point (° C.) | Viscosity (cP) | Present embodiment |
|---|---|---|---|---|
| | 11 | 3.9 | 6.2 | Yes |
| | 12 | 26.8 | — | No |
| | 13 | 8.8 | 6.2 | Yes |
| | 14 | 21.7 | 6.3 | Yes |
| | 15 | 15.4 | 6.3 | Yes |
| | 16 | 34.0 | — | No |
| | 17 | 16.7 | 6.3 | Yes |
| | 18 | 30.5 | — | No |
| | 19 | 22.7 | 6.4 | Yes |
| | 20 | 38.3 | — | No |
| (Chem. 8) | 21 | 21.7 | 6.4 | Yes |
| | 22 | 36.5 | — | No |
| | 23 | 27.4 | — | No |
| | 24 | 40.9 | — | No |
| (Chem. 9) | 20 | −13.6 | 6.3 | Yes |
| (Chem. 10) | 21 | −16.3 | 6.3 | Yes |

[Chem. 8]

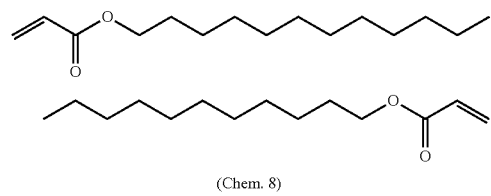

(Chem. 8)

TABLE 2-continued

This table lists the (A) component having the general formula (Chem. 1) according to an embodiment of the present invention and the melting point and viscosity thereof.

| Chemical formula | n | Melting point (° C.) | Viscosity (cP) | Present embodiment |
|---|---|---|---|---|

[Chem. 9]

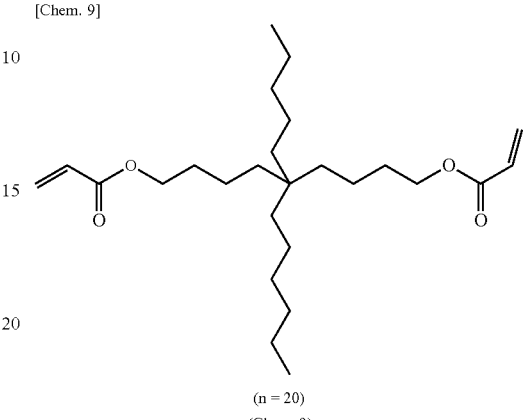

(n = 20)
(Chem. 9)

[Chem.10]

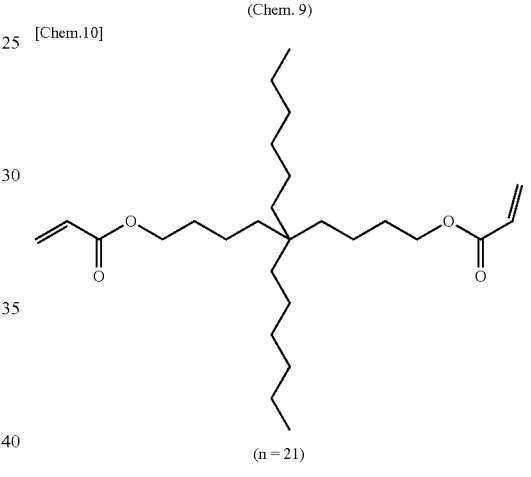

(n = 21)
(Chem. 10)

Demonstration Experiment Related to Fifth Embodiment

<Measurement of Viscosity>

The viscosities of the following (meth)acrylate monomers 1), 2), and 3) and a reference (meth)acrylate monomer 4) were measured with a digital viscometer LVDV-E (manufactured by Brookfield Engineering Laboratories). These monomers have the structural formulae (Chem. 11) to (Chem. 14).

1) phenoxyethyl acrylate (PhEA), trade name V#192 (Osaka Organic Chemical Industry Ltd.), (Chem. 11)

[Chem. 11]

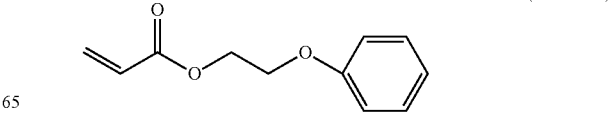

(Chem. 11)

2) phenoxypoly(ethylene glycol) acrylate, trade name AMP20GY (Shin Nakamura Chemical Co., Ltd.), (Chem. 12)

[Chem. 12]

(Chem. 12)

3) phenoxypoly(ethylene glycol) acrylate, trade name Aronix M-102 (Toagosei Co., Ltd.), (Chem. 13)

[Chem. 13]

(Chem. 13)

4) n-propyl acrylate, trade name n-propyl acrylate (Wako Pure Chemical Industries, Ltd.), (Chem. 14)

[Chem. 14]

(Chem. 14)

Table 3 lists the abbreviation and viscosity of the monomers. The viscosities of the monomers according to the present embodiment were lower than 40 cP.

TABLE 3

The table lists the (A) component that has the structures having the general formulae (Chem. 2) and (Chem. 3) according to an embodiment of the present invention and the viscosity thereof.

| Chemical formula | Abbreviation | Number of phenoxy groups | Number of ethylene glycol groups | Present embodiment | Condensable gas solubility | Viscosity (cP) |
|---|---|---|---|---|---|---|
| (Chem. 11) | PhEA | 1 | 1 | Yes | 0.2 | 8 |
| (Chem. 12) | PhPEG2A | 1 | 2 | Yes | 0.2 | 17 |
| (Chem. 13) | PhPEG4A | 1 | 4 | Yes | 0.2 | 33 |
| (Chem. 14) | NPA | 0 | 1 | No | 0.9 | 4 |

<Calculation of Viscosity and Melting Point>

The melting point and viscosity of the following monomer 5) having the general formulae (Chem. 2) and (Chem. 3) and n=2 in the general formula (Chem. 2) were calculated using commercially available software Hansen Solubility Parameters in Practice (HSPiP). This monomer has the following structural formula (Chem. 15).

5) 3-phenoxy-1,2-propane diacrylate, (Chem. 15)

[Chem. 15]

(Chem. 15)

Table 4 shows the calculation results. The monomer was a liquid and had a viscosity of 40 cP or less at room temperature.

The melting point and viscosity of the following monomers 6) and 7) having the general formula (Chem. 2) in which n is 5 and 6, respectively, were calculated in the same manner. These monomers have the structural formulae (Chem. 16) and (Chem. 17).

6) phenoxypoly(ethylene glycol) acrylate, (Chem. 16)

[Chem. 16]

(Chem. 16)

7) phenoxypoly(ethylene glycol) acrylate, (Chem. 17)

[Chem. 17]

(Chem. 17)

Table 4 shows the calculation results. These monomers were solids at room temperature.

Tables 3 and 4 show that the (A) component having the structural formula (Chem. 2) in which n is 4 or less had a melting point of 23° C. or less and a viscosity of 40 cP or less.

TABLE 4

This table lists the (A) component that has the structures having the general formulae (Chem. 2) and (Chem. 4) according to an embodiment of the present invention and the melting point and viscosity thereof calculated using commercially available software.

| Chemical formula | Abbreviation | Number of phenoxy groups | Number of ethylene glycol groups | Present embodiment | Melting point | Viscosity (cP) |
|---|---|---|---|---|---|---|
| (Chem. 15) | PhPEG2DA | 1 | 2 | Yes | −3.9 | 6.9 |
| (Chem. 16) | PhPEG5A | 1 | 5 | No | 76.8 | — |
| (Chem. 17) | PhPEG6A | 1 | 6 | No | 87.6 | — |

<Measurement of Maximum Condensable Gas Solubility>

Three grams of each of the (meth)acrylate monomers 1) to 4) was weighed into a 9-ml brown bottle.

1,1,1,3,3-pentafluoropropane (PFP) was used as a condensable gas to determine the maximum condensable gas solubility (gas/(curable composition+gas)) (g/g) of the (meth)acrylate monomers.

The maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas. Table 3 lists the measurement results of the maximum condensable gas solubility of the monomers.

Table 3 shows that the maximum condensable gas solubility was ≤0.4 when n in the general formula (Chem. 2) of each monomer component of the (A) component was 4 or less. More specifically, when the (A) component is a single monomer having the general formulae (Chem. 2) and (Chem. 4), n may be 4 or less. When the (A) component is composed of a plurality of monomers, the ratio of the monomers is determined such that the maximum condensable gas solubility is ≤0.4. Instead of 1,1,1,3,3-pentafluoropropane (PFP), 1H-nonafluorobutane ($CHF_2CF_2CF_2CF_3$, b.p. 14° C.) and 2H-nonafluorobutane ($CF_3CHFCF_2CF_3$, b.p. 15° C.) were used as condensable gases. The same measurement as described above showed that the maximum condensable gas solubility was 0.4 when n in the general formula (Chem. 2) was 4 or less. These condensable gases have a boiling point in the range of −10° C. to 23° C. at atmospheric pressure or a saturated vapor pressure in the range of 0.1 to 0.4 MPa at normal temperature (23° C.) (Measurement of Mold Releasability and Surface Roughness of Cured Product as Function of Condensable Gas Solubility)

A curable composition for imprinting was photo-cured under various conditions by the manufacturing process using a condensable gas illustrated in FIG. 1, and the demolding force and surface roughness were measured.

The condensable gas solubility can be controlled by changing the composition of the curable composition or altering part of the manufacturing conditions, such as the amount of condensable gas introduced. The condensable gas solubility can be determined by measuring the increased weight from a difference in the weight of the curable composition due to the dissolution of the condensable gas and dividing the increased weight by the total weight of the curable composition and the condensable gas.

A photopolymerization initiator Irgacure 907 (manufactured by Ciba Specialty Chemicals Co., Ltd.) was added to a mixture of isobornyl acrylate (IBOA) and hexanediol diacrylate (HDODA) to prepare a plurality of curable compositions 1 for imprint.

A silicon wafer was used as the substrate 2. NIM-80L RESO (manufactured by NTT Advanced Technology Corp.) was used as the mold 4. The compositions were irradiated with light at 50 mW/cm$^2$ for 10 seconds using an UV light source SP-7 (manufactured by Ushio Inc.). The demolding force was measured with a load cell TU-PAR (manufactured by TEAC Corp.) under various conditions.

The photo-cured products produced under various conditions were imprinted in the atmosphere without using the condensable gas (PFP), and the demolding force was measured. The relative demolding force (%) was calculated as the ratio of the demolding force in imprinting in the presence of the condensable gas to the demolding force in the atmosphere.

The surface roughness PV (peak to valley) of the photo-cured product removed from the mold was measured with an atomic force microscope Nanoscope manufactured by Nihon Veeco K.K. (measurement area: 2 μm×2 μm).

FIG. 4 shows the relationship between the demolding force and the surface roughness of the photo-cured film as a function of condensable gas solubility on the horizontal axis.

FIG. 4 shows that a condensable gas solubility of 0.4 or less resulted in a surface roughness PV of the photo-cured film of 4 nm or less and that a condensable gas solubility of 0.1 or more resulted in a demolding force of 80% or less of the demolding force measured in the absence of the condensable gas.

Thus, when the condensable gas solubility of the curable composition is 0.1 or more and 0.4 or less, the photo-cured product had a precise pattern corresponding to the mold asperities.

In addition, when the curable composition satisfies the formula 0.1≤maximum condensable gas solubility≤0.4, this obviates the necessity of precisely controlling the amount of condensable gas introduced and allows imprinting at a surface roughness PV of 4 nm or less and with a low demolding force.

(Measurement of Surface Roughness of Cured Product as Function of Maximum Condensable Gas Solubility Difference)

Curable compositions for imprinting containing different monomer combinations were photo-cured in the manufacturing process using a condensable gas illustrated in FIG. 1, and the surface roughness was measured.

Figure 7:
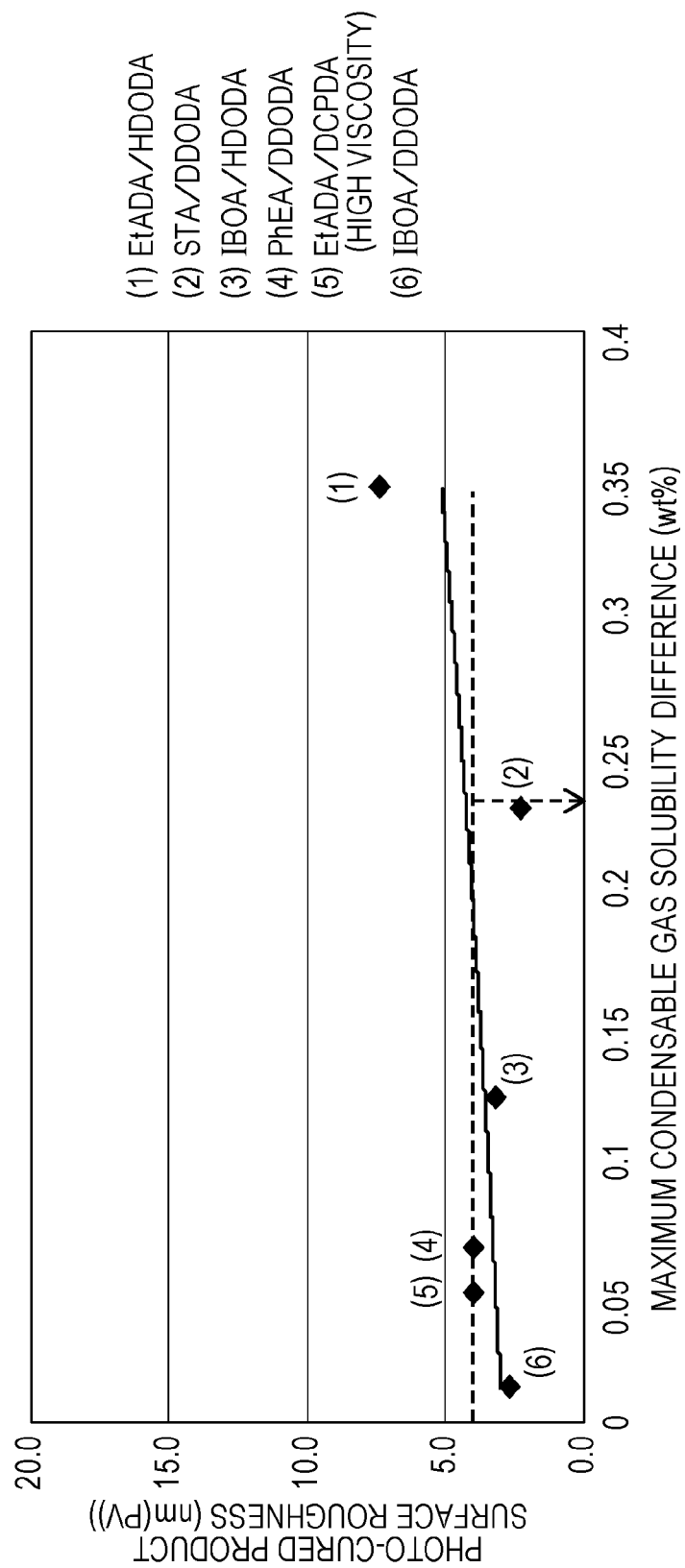
FIG. 7 is a graph of the relationship between maximum condensable gas solubility difference and surface roughness according to an embodiment of the present invention.

The maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas. FIG. 7 is a graph of the relationship between the surface roughness of the photo-cured film as a function of the maximum condensable gas solubility difference between the monomers on the horizontal axis. FIG. 7 shows that a maximum condensable gas solubility difference of 0.23 or less resulted in a surface roughness PV of the photo-cured film of 4 nm or less.

Comparative Example

A hundred parts of a (meth)acrylate monomer hexanediol diacrylate, trade name V#230 (Osaka Organic Chemical Industry Ltd.) was mixed with 3 parts of a photopolymerization initiator Irgacure 369 (manufactured by Ciba Specialty Chemicals Co., Ltd.) to prepare the curable composition 1 for imprinting. V#230 (Osaka Organic Chemical Industry Ltd.) has no ring structure, that is, $M_{CR}/M_{TOT}=0$, $N_{TOT}/(N_C-N_O)=4.25$, and Ra*MW=760, 5. V#230 has the general formula (Chem. 1) in which n is 6, does not have the general formulae (Chem. 2) and (Chem. 3), and has a PFP solubility of 0.5. A photo-cured film of the curable composition 1 was formed in the manufacturing process illustrated in FIG. 1 using nitrogen gas instead of the condensable gas. The surface roughness PV of the photo-cured film was 2 nm as measured in the same manner as Reference Example.

A photo-cured film was then formed in the presence of a condensable gas 1,1,1,3,3-pentafluoropropane. Although the photo-cured film had a sufficiently low demolding force, the surface roughness PV was 23 nm.

Example 1

(Meth)acrylate monomers, 50 parts of stearyl acrylate, trade name STA (Osaka Organic Chemical Industry Ltd.), 25 parts of isostearyl acrylate, trade name ISTA (Osaka Organic Chemical Industry Ltd.), and 25 parts of 1,10-decanediol diacrylate, trade name A-DOD-N(Shin Nakamura Chemical Co., Ltd.), were mixed with 3 parts of a photopolymerization initiator Irgacure 369 (manufactured by Ciba Specialty Chemicals Co., Ltd.) to prepare the curable composition 1 for imprinting. This composition had $N_{TOT}/(N_C-N_O)$ of 3.44 and Ra*MW of 1871. The condensable gas solubility was 0.21 as measured in the same manner as Reference Example using PFP. The viscosity (23° C.) of the composition was 9.8 cP. The condensable gas solubility difference of the monomers was 0.23.

In accordance with the manufacturing process illustrated in FIG. 1, the curable composition 1 applied to the substrate 2 was irradiated with light through the mold 4 in the presence of nitrogen or a condensable gas 1,1,1,3,3-pentafluoropropane to produce a photo-cured film having a pattern corresponding to the surface asperities of the mold 4. The surface roughness PV of the photo-cured film was measured in the same manner as Reference Example. The surface roughness of the photo-cured film produced in the nitrogen atmosphere was 2 nm, and the surface roughness of the photo-cured film produced in the condensable gas atmosphere was 3 nm. A photo-cured film having a surface roughness of 4 nm or less was formed even in the presence of the condensable gas.

Example 2

(Meth)acrylate monomers, 75 parts of isobornyl acrylate, trade name IB-XA (Kyoeisha Chemical Co., Ltd.) and 25 parts of A-DOD-N(Shin Nakamura Chemical Co., Ltd.), were mixed with 3 parts of a photopolymerization initiator Irgacure 369 (manufactured by Ciba Specialty Chemicals Co., Ltd.) to prepare the curable composition 1 for imprinting. This composition had $M_{CR}/M_{TOT}$ of 0.41, $N_{TOT}/(N_C-N_O)$ of 3.34, and Ra*MW of 1291. The condensable gas solubility was 0.30 as measured in the same manner as Reference Example using PFP. The viscosity (23° C.) of the composition was 7.4 cP. The condensable gas solubility difference of the monomers was 0.01.

In accordance with the manufacturing process illustrated in FIG. 1, the curable composition 1 applied to the substrate 2 was irradiated with light through the mold 4 in the presence of nitrogen or a condensable gas 1,1,1,3,3-pentafluoropropane to produce a photo-cured film having a pattern corresponding to the surface asperities of the mold 4. The surface roughness PV of the photo-cured film was measured in the same manner as Reference Example. The surface roughness of the photo-cured film produced in the nitrogen atmosphere was 3 nm, and the surface roughness of the photo-cured film produced in the condensable gas atmosphere was 4 nm. A photo-cured film having a surface roughness of 4 nm or less was formed even in the presence of the condensable gas.

Example 3

(Meth)acrylate monomers, 75 parts of phenoxyethyl acrylate, trade name V#192 (Osaka Organic Chemical Industry Ltd.) and 25 parts of A-DOD-N(Shin Nakamura Chemical Co., Ltd.), were mixed with 3 parts of a photopolymerization initiator Irgacure 369 (manufactured by Ciba Specialty Chemicals Co., Ltd.) to prepare the photo-curable composition 1 for imprinting. The photo-curable composition 1 had $M_{CR}/M_{TOT}$ of 0.41, $N_{TOT}/(N_C-N_O)$ of 3.40 and Ra*MW of 1031. The condensable gas solubility was 0.23 as measured in the same manner as Reference Example using PFP. The viscosity (23° C.) of the composition was 8.3 cP. The condensable gas solubility difference of the monomers was 0.06.

In accordance with the manufacturing process illustrated in FIG. 1, the curable composition 1 applied to the substrate 2 was irradiated with light through the mold 4 in the presence of nitrogen or a condensable gas 1,1,1,3,3-pentafluoropropane to produce a photo-cured film having a pattern corresponding to the surface asperities of the mold 4. The surface roughness PV of the photo-cured film was measured in the same manner as Reference Example. The surface roughness of the photo-cured film produced in the nitrogen atmosphere was 4 nm, and the surface roughness of the photo-cured film produced in the condensable gas atmosphere was 4 nm. A photo-cured film having a surface roughness of 4 nm or less was formed even in the presence of the condensable gas.

Example 4

(Meth)acrylate monomers, 75 parts of isobornyl acrylate, trade name IB-XA (Kyoeisha Chemical Co., Ltd.) and 25 parts of V#230 (Osaka Organic Chemical Industry Ltd.), were mixed with 3 parts of a photopolymerization initiator Irgacure 369 (manufactured by Ciba Specialty Chemicals Co., Ltd.) to prepare the curable composition 1 for imprinting. This composition had $M_{CR}/M_{TOT}$ of 0.41, $N_{TOT}/(N_C-N_O)$ of 3.44 and Ra*MW of 1175. The condensable gas solubility was 0.35 as measured in the same manner as Reference Example using PFP. The viscosity (23° C.) of the composition was 7.8 cP. The condensable gas solubility difference of the monomers was 0.12.

In accordance with the manufacturing process illustrated in FIG. 1, the curable composition 1 applied to the substrate 2 was irradiated with light through the mold 4 in the presence of nitrogen or a condensable gas 1,1,1,3,3-pentafluoropropane to produce a photo-cured film having a pattern corresponding to the surface asperities of the mold 4. The surface roughness PV of the photo-cured film was measured in the same manner as Reference Example. The surface roughness of the photo-cured film produced in the nitrogen atmosphere was 4 nm, and the surface roughness of the photo-cured film produced in the condensable gas atmosphere was 4 nm. A photo-cured film having a surface roughness of 4 nm or less was formed even in the presence of the condensable gas.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-263533, filed Nov. 30, 2012; No. 2013-216663, filed Oct. 17, 2013; No. 2013-216664, filed Oct. 17, 2013; and No. 2013-242001, filed Nov. 22, 2013, which are hereby incorporated by reference herein in its entirety.

The invention claimed is:

1. An imprinting method for forming a pattern of a cured product by irradiating a curable composition for imprinting disposed on a substrate with light while the curable composition is in contact with a mold having surface asperities and removing the mold from a cured product of the curable composition, the imprinting method comprising:
bringing the mold into contact with the curable composition in a condensable gas atmosphere,
wherein the curable composition for imprinting has a viscosity in the range of 1 cP to 40 cP in air at 23° C., and
the condensable gas is introduced between the mold and the curable composition such that the curable composition for imprinting has a condensable gas solubility (gas/(curable composition+gas)) (g/g) in the range of 0.1 to 0.4.

2. The imprinting method according to claim 1, wherein the curable composition for imprinting has a maximum condensable gas solubility (gas/(curable composition+gas)) (g/g) in the range of 0.1 to 0.4, and
wherein the maximum condensable gas solubility is determined by charging a 9-ml brown bottle with 3 g of the curable composition, measuring the weight of the curable composition at 23° C. at 1 atm before and after bubbling of the condensable gas at a flow rate of 0.1 L/min for 15 minutes, and dividing the increased weight due to the bubbling by the total weight of the curable composition and the condensable gas.

3. The imprinting method according to claim 2, wherein the curable composition for imprinting contains at least one (meth)acrylate monomer as an (A) component, and
a polymerization initiator as a (B) component, and
the (A) component has a carbon atom ring structure, and the relationship between the amount of carbon $M_{CR}$ of the ring structure and the total amount of carbon $M_{TOT}$ of the (A) component satisfies the following formula $0.3 < M_{CR}/M_{TOT} \leq 0.8$.

4. The imprinting method according to claim 2,
wherein the curable composition for imprinting contains at least one (meth)acrylate monomer as an (A) component, and
a polymerization initiator as a (B) component, and
the Hansen distance (Ra') between the condensable gas and the (A) component monomer and the molecular weight (MW) of the monomer satisfies the following formula $800 < Ra'*MW < 3800 [(MPa)^{1/2}]$.

5. The imprinting method according to claim 2,
wherein the curable composition for imprinting includes at least two (meth)acrylate monomers, and
the maximum condensable gas solubility (gas/(curable composition+gas)) (g/g) difference between the monomers is 0.23 or less.

6. The imprinting method according to claim 2,
wherein the curable composition for imprinting contains at least one (meth)acrylate monomer as an (A) component, and
a polymerization initiator as a (B) component, and
at least one of the (A) component monomer has a viscosity in the range of 1 cP to 40 cP in air at 23° C. and includes a structure having the formula

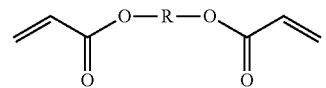

wherein $R=C_nH_{2n}$ and n is 9 or more.

7. The imprinting method according to claim 2,
wherein the curable composition for imprinting contains at least one (meth)acrylate monomer as an (A) component, and
a polymerization initiator as a (B) component, and
at least one of the (A) component monomer has a viscosity in the range of 1 cP to 40 cP in air at 23° C. and includes a structure having the formulae

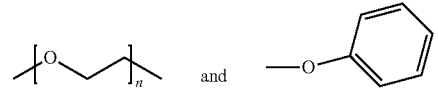

wherein n is 4 or less.

8. The imprinting method according to claim 1, wherein the condensable gas has a boiling point in the range of −10° C. to 23° C.

9. The imprinting method according to claim 1, wherein the condensable gas has a saturated vapor pressure in the range of 0.1 to 0.4 MPa at 23° C.

10. The imprinting method according to claim 1, further comprising placing the curable composition for imprinting on the substrate, wherein the placing of the curable composition for imprinting includes discretely arranging droplets of the curable composition on the substrate using an ink jet method.

11. A method for manufacturing an article, comprising:
forming a pattern of a cured product of a curable composition on a substrate using the imprinting method according to claim 1; and processing the substrate on which the pattern has been formed.

\* \* \* \* \*